US012620975B2

(12) United States Patent
Sato

(10) Patent No.: US 12,620,975 B2
(45) Date of Patent: May 5, 2026

(54) ELECTRONIC COMPONENT

(71) Applicant: TDK CORPORATION, Tokyo (JP)

(72) Inventor: Takuya Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 127 days.

(21) Appl. No.: 18/429,877

(22) Filed: Feb. 1, 2024

(65) Prior Publication Data

US 2024/0275361 A1 Aug. 15, 2024

(30) Foreign Application Priority Data

Feb. 14, 2023 (JP) ................................. 2023-021173

(51) Int. Cl.
H03H 9/64 (2006.01)
H03H 7/01 (2006.01)
H03H 9/25 (2006.01)

(52) U.S. Cl.
CPC ............ H03H 9/64 (2013.01); H03H 7/0138 (2013.01); H03H 9/25 (2013.01)

(58) Field of Classification Search
CPC .......... H03H 9/64; H03H 7/0138; H03H 9/25; H03H 7/0115; H03H 9/72; H03H 2001/0085; H03H 9/02015; H03H 9/02543; H03H 9/131; H03H 7/40; H03H 9/6483; H03H 9/725; H03H 9/145; H03H 9/54; H03H 9/02637; H03H 9/6436; H03H 9/706; H03H 7/1766; H03H 7/463; H03H 9/0566; H03H 9/0576; H03H 9/14541; H03H 9/205; H03H 7/1775; H03H 9/02574; H03H 9/059; H03H 9/1457; H03H 9/568; H03H 9/605; H03H 9/6403; H03H 2001/0057; H03H 7/1708; H03H 9/02992; H03H 9/14532; H03H 9/542; H03H 9/6406; H03H 9/6496; H03H 7/46; H03H 9/13; H03H 9/17; H03H 9/564; H03H 9/703; H03H 7/09; H03H 7/18; H03H 9/6489; H03H 1/00; H03H 9/02086; H03H 9/0542; H03H 9/14594; H03H 9/70; H03H 9/02;
(Continued)

(56) References Cited

U.S. PATENT DOCUMENTS

| | | | |
|---|---|---|---|
| 9,148,106 B2 * | 9/2015 | Iwaki | H03H 9/0571 |
| 2003/0214368 A1 * | 11/2003 | Taniguchi | H03H 9/72 |
| | | | 333/133 |

(Continued)

FOREIGN PATENT DOCUMENTS

| | | |
|---|---|---|
| JP | 2009-296167 A | 12/2009 |

*Primary Examiner* — John W Poos
(74) *Attorney, Agent, or Firm* — Oliff PLC

(57) ABSTRACT

An electronic component includes a first main body and a second main body mounted on the first main body. The first main body includes a common terminal, a second signal terminal, and a circuit section including first to fourth inductors. The second main body includes first to third acoustic wave elements electrically connected to the circuit section. The first acoustic wave element is connected in parallel with the first inductor. The second acoustic wave element is connected in parallel with the second and third inductors. The third acoustic wave element is connected in parallel with the fourth inductor. The first to third acoustic wave elements, in a state of being electrically connected to the circuit section, are not electrically connected to the ground.

10 Claims, 17 Drawing Sheets

(58) Field of Classification Search
CPC .......... H03H 9/02228; H03H 9/02559; H03H
9/02818; H03H 9/02834; H03H 9/02866;
H03H 9/0523; H03H 9/0557; H03H
9/1014; H03H 9/14538; H03H 9/14544;
H03H 7/1758; H03H 9/02007; H03H
9/02614; H03H 9/132; H03H 9/133;
H03H 9/175; H03H 2007/013; H03H
2009/02496; H03H 2009/02503; H03H
2009/02519; H03H 2210/012; H03H
2210/015; H03H 3/0072; H03H 7/0161;
H03H 7/1783; H03H 7/19; H03H 7/42;
H03H 7/482; H03H 9/0222; H03H
9/02259; H03H 9/02433; H03H 9/02842;
H03H 9/0561; H03H 9/0571; H03H
9/1057; H03H 9/14502; H03H 9/2431;
H03H 9/2436; H03H 9/2457; H03H
9/2463; H03H 9/44; H03H 9/58; H03H
9/587; H03H 9/6413; H03H 9/6476;
H03H 9/6479; H03H 9/66; H03H 9/68;
H03H 2001/0021; H03H 7/00; H03H
7/01; H03H 7/0123; H03H 7/03; H03H
7/075; H03H 7/1725; H03H 7/175; H03H
7/1791; H03H 7/465; H03H 7/48; H03H
9/0009; H03H 9/0085; H03H 9/02031;
H03H 9/02047; H03H 9/0207; H03H
9/02125; H03H 9/02157; H03H 9/02826;
H03H 9/02952; H03H 9/0547; H03H
9/174; H03H 9/176; H03H 9/46; H03H
9/48; H03H 9/562; H03H 9/566; H03H
9/582; H03H 9/589; H03H 9/60; H03H
9/6426; H03H 9/74
See application file for complete search history.

(56) References Cited

U.S. PATENT DOCUMENTS

2004/0130410 A1*  7/2004  Nishimura ............... H04B 1/52
                                              333/191
2015/0155850 A1*  6/2015  Kuzushita ................ H03H 9/24
                                              333/133
2017/0214390 A1*  7/2017  Tsukamoto .......... H03H 7/1766

* cited by examiner 631　63T1

63

64T1

64

642

643

641

65T1

65

652

653

651

66T1

66

67T1

67

671

68T1

68

681

ELECTRONIC COMPONENT

CROSS REFERENCE TO RELATED APPLICATIONS

This application claims the benefit of Japanese Priority Patent Application No. 2023-21173 filed on Feb. 14, 2023, the entire contents of which are incorporated herein by reference.

BACKGROUND OF THE INVENTION

1. Field of the Invention

The present invention relates to an electronic component with a second main body mounted on a first main body.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port.

As the filters, an LC filter configured using an inductor and a capacitor, and an acoustic wave filter configured using an acoustic wave element are known. For example, JP 2009-296167 A1 discloses a filter including a plurality of surface acoustic wave (SAW) resonators. This filter is provided with a plurality of SAW resonators each having one end connected to the ground.

Here, it is considered that one of two filters included in a branching filter is configured using an LC filter and the other one is configured using a filter including an acoustic wave element. There has been a demand for downsizing of a branching filter used in a compact communication apparatus in particular. As an LC filter suitable to be downsized, an LC filter using a stack including a plurality of dielectric layers and a plurality of conductor layers stacked together is known. When an LC filter is configured using such a stack, it is possible to mount an acoustic wave element on a top surface of the stack, thus allowing the branching filter to be downsized.

When an acoustic wave element is mounted on the top surface of the stack, a plurality of terminals are provided on a bottom surface of the stack. The plurality of terminals include a ground terminal connected to the ground. When the acoustic wave element is designed to be connected to the ground, the acoustic wave element is electrically connected to the ground terminal via inside of the stack. In this case, a path from the acoustic wave element to the ground terminal is relatively long. The longer a path from the acoustic wave element to the ground terminal is, the greater the floating inductance caused by the path is, leading to a problem in that adjustment to achieve a desired characteristic is difficult.

SUMMARY OF THE INVENTION

An objective of the present invention is to provide an electronic component with a second main body including an acoustic wave element and mounted on a first main body, wherein the electronic component allows a desired characteristic to be easily achieved.

An electronic component according to the present invention includes a first main body including a plurality of dielectric layers stacked together and a second main body mounted on the first main body. The first main body includes a common terminal, at least one signal terminal, and a circuit section provided between the common terminal and the at least one signal terminal in a circuit configuration. The circuit section includes at least one inductor. The second main body includes at least one acoustic wave element that is electrically connected to the circuit section and that is connected in parallel with the at least one inductor. The at least one acoustic wave element, in a state of being electrically connected to the circuit section, is not electrically connected to a ground.

In the electronic component according to the present invention, the at least one acoustic wave element, in a state of being electrically connected to the circuit section, is not electrically connected to the ground. Thus, the present invention allows a desired characteristic to be easily achieved.

Other and further objectives, features, and advantages of the present invention will appear more fully from the following description.

BRIEF DESCRIPTION OF THE DRAWINGS

FIGS. 9A to 9C are explanatory diagrams showing respective patterned surfaces of thirteenth to fifteenth dielectric layers in the first main body in the embodiment of the present invention.

DETAILED DESCRIPTION OF THE PREFERRED EMBODIMENTS

Figure 1:
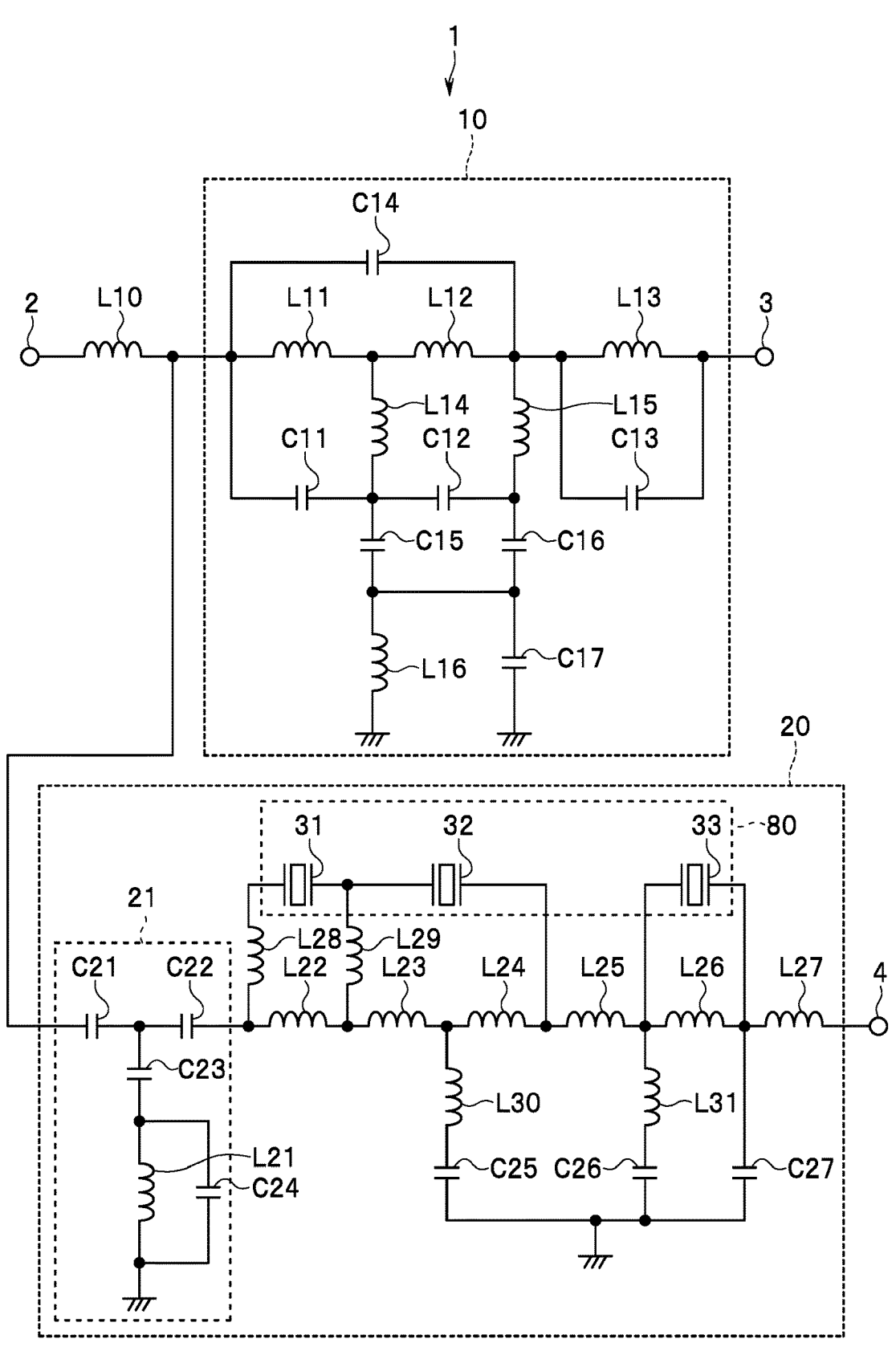
FIG. 1 is a circuit diagram showing a circuit configuration of an electronic component according to an embodiment of the present invention.

An embodiment of the present invention will be described below in detail with reference to the drawings. First, a schematic configuration of an electronic component 1 according to an embodiment of the present invention will be described with reference to FIG. 1. FIG. 1 is a circuit diagram showing a circuit configuration of the electronic component 1.

The electronic component 1 according to the present embodiment is a branching filter (diplexer) including a first filter 10 and a second filter 20. The first filter 10 is configured to selectively pass a first signal of a frequency within a first passband. The second filter 20 is configured to selectively pass a second signal of a frequency within a second passband higher than the first passband.

The first filter 10 is an LC filter including at least one inductor and at least one capacitor. The second filter 20 is a filter, of so-called hybrid type, including at least one inductor, at least one capacitor, and at least one acoustic wave element. Examples of the at least one acoustic wave element may include a bulk acoustic wave element and a surface acoustic wave element.

The electronic component 1 further includes a common terminal 2, a first signal terminal 3, and a second signal terminal 4. The first filter 10 is provided between the common terminal 2 and the first signal terminal 3 in the circuit configuration. The second filter 20 is provided between the common terminal 2 and the second signal terminal 4 in the circuit configuration. Note that, in the present application, the expression "in the (a) circuit configuration" is used to indicate not layout in physical configuration but layout in the circuit diagram.

Next, an example of a circuit configuration of the electronic component 1 will be described with reference to FIG. 1. The electronic component 1 further includes an inductor L10 having one end connected to the common terminal 2.

The first filter 10 includes a low-pass filter circuit including at least one inductor and at least one capacitor. In the example shown in FIG. 1, the first filter 10 includes inductors L11, L12, L13, L14, L15, and L16, and capacitors C11, C12, C13, C14, C15, C16, and C17.

One end of the inductor L11 is connected to the other end of the inductor L10. One end of the inductor L12 is connected to the other end of the inductor L11. One end of the inductor L13 is connected to the other end of the inductor L12. The other end of the inductor L13 is connected to the first signal terminal 3.

One end of the inductor L14 is connected to a connection point between the inductors L11 and L12. One end of the inductor L15 is connected to the other end of the inductor L12.

One end of the capacitor C11 is connected to the one end of the inductor L11. The other end of the capacitor C11, one end of the capacitor C12, and one end of the capacitor C15 are connected to the other end of the inductor L14. The other end of the capacitor C12 and one end of the capacitor C16 are connected to the other end of the inductor L15.

The capacitor C13 is connected in parallel with the inductor L13. One end of the capacitor C14 is connected to the one end of the inductor L11. The other end of the capacitor C14 is connected to the other end of the inductor L12.

One end of the inductor L16 is connected to the other end of the capacitor C15, and one end of the capacitor C17 is connected to the other end of the capacitor C16. The other end of each of the inductor L16 and the capacitor C17 is connected to the ground.

The second filter 20 includes a circuit section including at least one inductor and at least one capacitor, at least one acoustic wave element, and a high-pass filter circuit 21 connected to the circuit section in series. In the example shown in FIG. 1, the high-pass filter circuit 21 includes an inductor L21, and capacitors C21, C22, C23, and C24.

One end of the capacitor C21 is connected to the other end of the inductor L10. One end of the capacitor C22 is connected to the other end of the capacitor C21. One end of the capacitor C23 is connected to the connection point between the capacitors C21 and C22.

One end of the inductor L21 is connected to the other end of the capacitor C23. The other end of the inductor L21 is connected to the ground. The capacitor C24 is connected in parallel with the inductor L21.

In the example shown in FIG. 1, the at least one inductor in the circuit section of the second filter 20 is a plurality of inductors L22, L23, L24, L25, L26, and L27. The at least one capacitor in the circuit section of the second filter 20 is a plurality of capacitors C25, C26, and C27. The at least one acoustic wave element is a plurality of acoustic wave elements 31, 32, and 33.

The circuit section of the second filter 20 further includes inductors L28, L29, L30, and L31. The circuit section of the second filter 20 is a circuit including the inductors L22 to L31 and the capacitors C25 to C27, but excluding the high-pass filter circuit 21 and the acoustic wave elements 31 to 33 in the second filter 20. The high-pass filter circuit 21 is provided between the common terminal 2 and the circuit section in the circuit configuration.

One end of the inductor L22 is connected to the other end of the capacitor C22. One end of the inductor L23 is connected to the other end of the inductor L22. One end of the inductor L24 is connected to the other end of the inductor L23. One end of the inductor L25 is connected to the other end of the inductor L24. One end of the inductor L26 is connected to the other end of the inductor L25. One end of the inductor L27 is connected to the other end of the inductor L26. The other end of the inductor L27 is connected to the second signal terminal 4.

One end of the inductor L28 is connected to the one end of the inductor L22. One end of the inductor L29 is connected to a connection point between the inductors L22 and L23.

One end of the acoustic wave element 31 is connected to the other end of the inductor L28. The other end of the acoustic wave element 31 and one end of the acoustic wave element 32 is connected to the other end of the inductor L29. The other end of the acoustic wave element 32 is connected to a connection point between the inductors L24 and L25. One end of the acoustic wave element 33 is connected to a connection point between the inductors L25 and L26. The other end of the acoustic wave element 33 is connected to a connection point between the inductors L26 and L27.

One end of the inductor L30 is connected to a connection point between the inductors L23 and L24. One end of the inductor L31 is connected to the connection point between the inductors L25 and L26.

One end of the capacitor C25 is connected to the other end of the inductor L30. One end of the capacitor C26 is connected to the other end of the inductor L31. One end of the capacitor C27 is connected to the connection point between the inductors L26 and L27. The other end of each of the capacitors C25 to C27 is connected to the ground.

The inductor L22 is connected in parallel with the acoustic wave element 31. The inductors L23 and L24 are connected in parallel with the acoustic wave element 32. The inductor L26 is connected in parallel with the acoustic wave element 33.

The acoustic wave elements 31 to 33 are electrically connected in series. The inductors L22 to L27 are electrically connected in series. Note that an aspect in which two elements are electrically connected in series includes an aspect in which the two elements are connected in series via a conductor and an aspect in which the two elements are connected in series via an inductor. On the other hand, the aspect in which two elements are electrically connected in series does not include an aspect in which a conductor on a path connecting the two elements is interrupted, such as an aspect in which the two elements are connected to each other via a capacitor.

Each of the acoustic wave elements 31 to 33, in a state of being electrically connected to the circuit section of the second filter 20, is not electrically connected to the ground. In the present embodiment in particular, the conductors on the paths connecting both end of each of the acoustic wave elements 31 to 33 and the ground are interrupted by a capacitor.

Concerning the acoustic wave element 31, in the second filter 20, there are a first path and a second path, the first path connecting one end of the acoustic wave element 31 and the ground, the second path connecting the other end of the acoustic wave element 31 and the ground, the second path not via the same element(s) as those in the first path. The first path is a path via the high-pass filter circuit 21. The conductor on the first path is interrupted by the capacitor C22. The conductor on the second path is interrupted by capacitor C25, capacitor C26, or capacitor C27.

Concerning the acoustic wave element 32, in the second filter 20, there are a third path and a fourth path, the third path connecting one end of the acoustic wave element 32 and the ground, the fourth path connecting the other end of the acoustic wave element 32 and the ground, the fourth path not via the same element(s) as those in the third path. The third path may be a path via the inductors L29 and L22 and the high-pass filter circuit 21 in order or may be a path via the inductors L29, L23, and L30 in order. The conductor on the former path is interrupted by the capacitor C22. The conductor on the latter path is interrupted by the capacitor C25.

As long as the condition that the fourth path is not via the same element(s) as those in the third path is satisfied, the fourth path may be a path via the inductors L24 and L30 in order or may be a path via the inductor L25. The conductor on the former path is interrupted by capacitor C25. The conductor on the latter path is interrupted by the capacitor C26 or capacitor C27.

Concerning the acoustic wave element 33, in the second filter 20, there are a fifth path and a sixth path, the fifth path connecting one end of the acoustic wave element 33 and the ground, the sixth path connecting the other end of the acoustic wave element 33 and the ground, the sixth path not via the same element(s) as those in the fifth path. The fifth path is a path via the capacitor C27. The conductor on the fifth path is interrupted by the capacitor C27. The conductor on the sixth path is interrupted by the capacitor C22, capacitor C25, or capacitor C26.

Figure 2:
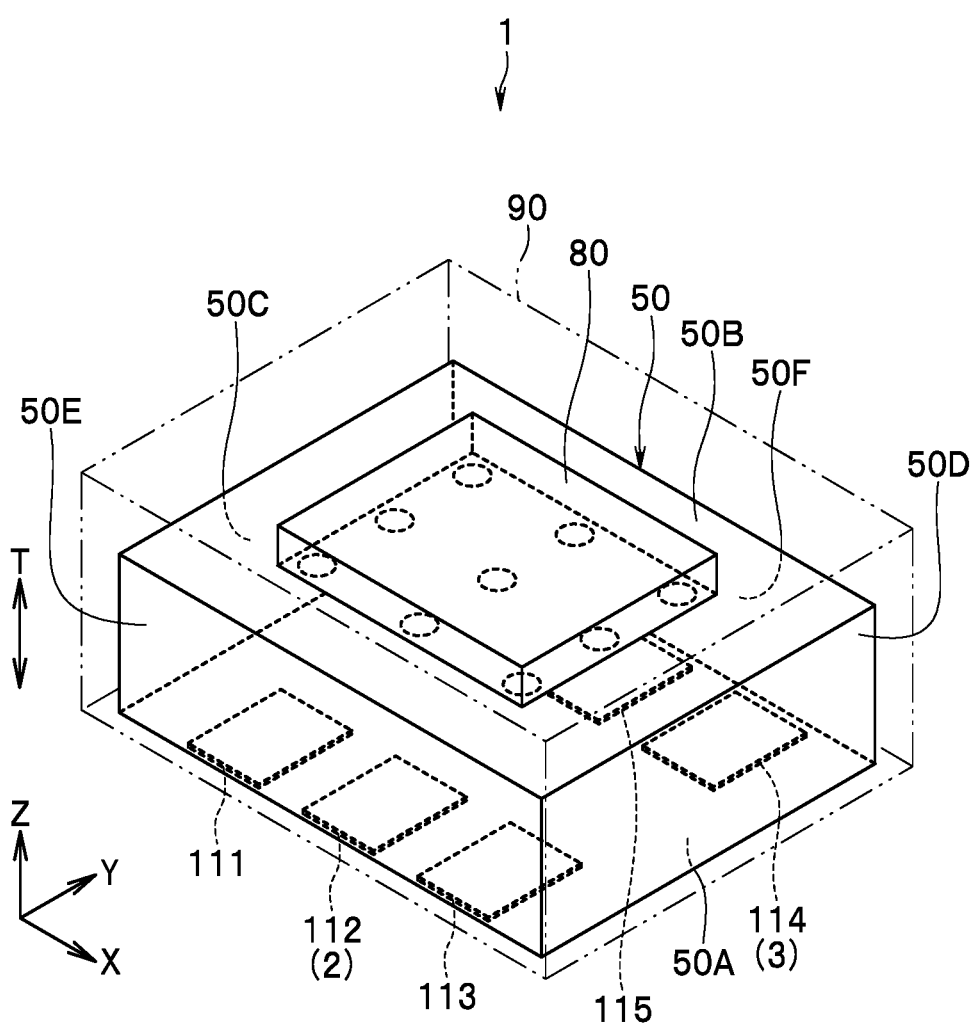
FIG. 2 is a perspective view showing the electronic component according to the embodiment of the present invention.
Figure 3:
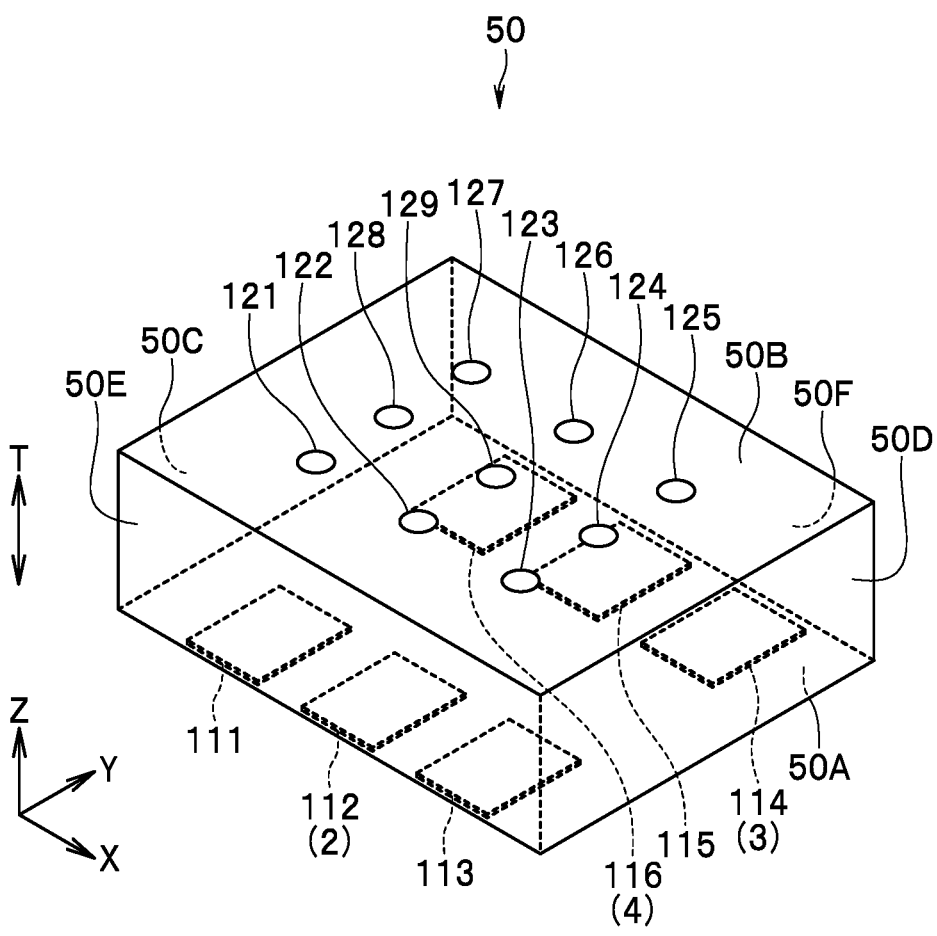
FIG. 3 is a perspective view showing a first main body in the embodiment of the present invention.
Figure 4:
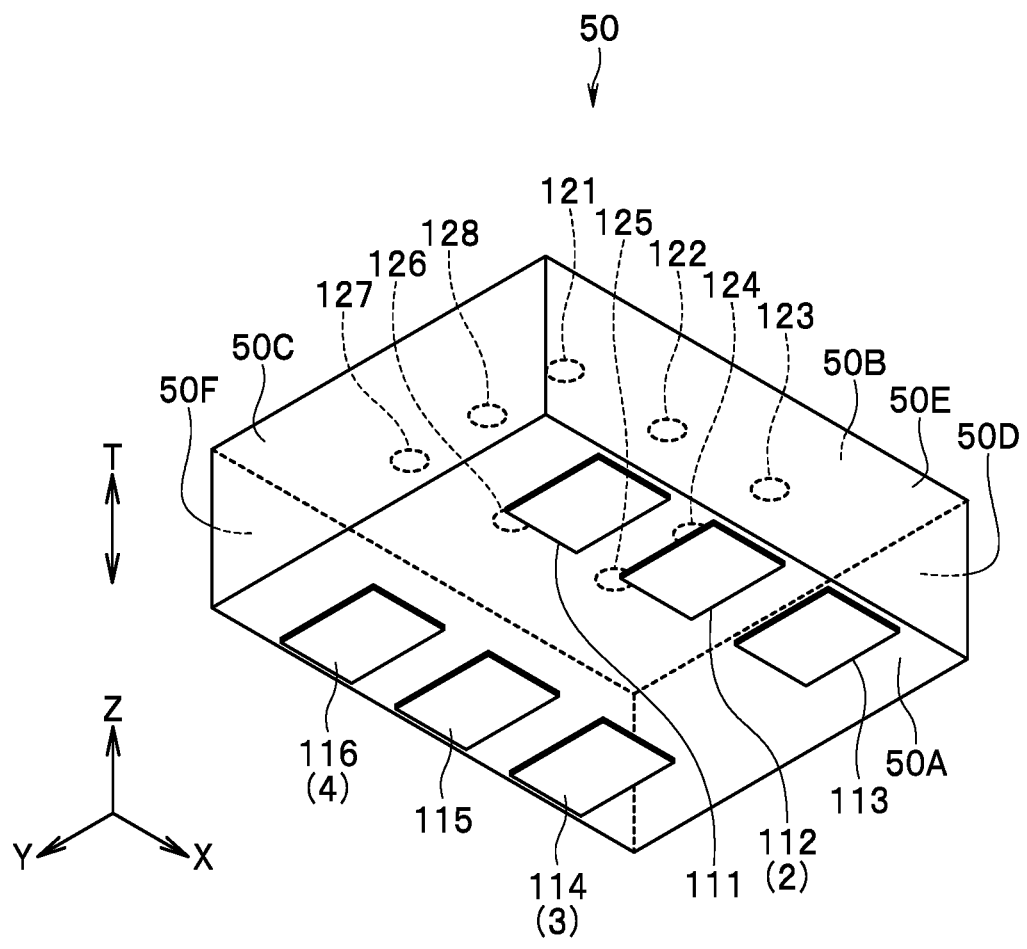
FIG. 4 is a perspective view showing the first main body in the embodiment of the present invention.

Next, other configurations of the electronic component 1 will be described with reference to FIGS. 2 to 4. FIG. 2 is a perspective view showing the electronic component 1. FIGS. 3 and 4 are each a perspective view showing a first main body.

The electronic component 1 includes a first main body 50 including a plurality of dielectric layers stacked together, a second main body 80 mounted on the first main body 50, and a sealing part 90 sealing the first main body 50 and the second main body 80. The sealing part 90 is formed of a resin, for example.

The first main body 50 includes the common terminal 2, the first signal terminal 3, the second signal terminal 4, the first filter 10, the high-pass filter circuit 21 of the second filter 20, and the circuit section of the second filter 20.

The second main body 80 includes at least one acoustic wave element that is electrically connected to the circuit section of the second filter 20 and that is connected in parallel with at least one inductor in the circuit section of the second filter 20. In the present embodiment in particular, the second main body 80 includes the acoustic wave elements 31 to 33.

The first main body 50 includes a first surface 50A and a second surface 50B located at opposite ends in the stacking direction T of the plurality of dielectric layers, and four side surfaces 50C to 50F connecting the first surface 50A and the second surface 50B. The side surfaces 50C and 50D are opposite to each other, and also the side surfaces 50E and 50F are opposite to each other. The side surfaces 50C to 50F each are perpendicular to both of the first surface 50A and the second surface 50B.

Here, an X direction, a Y direction, and a Z direction will be defined as shown in FIGS. 2 to 4. The X direction, the Y direction, and the Z direction are orthogonal to one another. In the present embodiment, one direction parallel to the stacking direction is referred to as the Z direction. The Z direction is also one direction parallel to a direction in which the first main body 50 and the second main body 80 are arranged. The opposite directions to the X, Y, and Z directions are defined as −X, −Y, and −Z directions, respectively. The expression "when seen in the stacking direction T" means that an object is viewed from a position away in the Z or −Z direction.

As shown in FIGS. 3 and 4, the first surface 50A is located at an end of the first main body 50 in the Z direction. The first surface 50A is located at an end of the first main body 50 in the −Z direction. The first surface 50A is also a bottom surface of the first main body 50. The second surface 50B is located at an end of the first main body 50 in the Z direction. The second surface 50B is also a top surface of the first main body 50 and is also a mounting surface for the second main body 80 to be mounted on. FIG. 3 shows the first main body 50 in a view from the second surface 50B side. FIG. 4 shows the first main body 50 in a view from the first surface 50A side.

The side surface 50C is located at an end of the first main body 50 in the –X direction. The side surface 50D is located at an end of the first main body 50 in the X direction. The side surface 50E is located at an end of the first main body 50 in the –Y direction. The side surface 50F is located at an end of the first main body 50 in the Y direction.

The first main body 50 further includes a plurality of electrodes 111, 112, 113, 114, 115, and 116 provided on the first surface 50A of the first main body 50. The electrodes 111, 112, and 113 are arranged in this order in the X direction at positions closer to the side surface 50E than to the side surface 50F. The electrodes 114, 115, and 116 are arranged in this order in the –X direction at positions closer to the side surface 50F than to the side surface 50E.

The electrode 112 corresponds to the common terminal 2. The electrode 114 corresponds to the first signal terminal 3. The electrode 116 corresponds to the second signal terminal 4. Accordingly, the common terminal 2, the first signal terminal 3, and the second signal terminal 4 are provided on the first surface 50A of the first main body 50. Each of the electrodes 111, 113, and 115 is connected to the ground.

The first main body 50 further includes a plurality of electrodes 121, 122, 123, 124, 125, 126, 127, 128, and 129 provided on the second surface 50B of the first main body 50. The plurality of electrodes 121 to 129 are used for electrical connection between the first main body 50 and the second main body 80. The electrodes 121, 122, and 123 are arranged in this order in the X direction at positions closer to the side surface 50E than to the side surface 50F. The electrodes 125, 126, and 127 are arranged in this order in the –X direction at positions closer to the side surface 50F than to the side surface 50E. The electrode 124 is arranged between the electrodes 123 and 125. The electrode 128 is arranged between the electrodes 121 and 127. The electrode 129 is arranged between the electrodes 122 and 126.

The second main body 80 is mounted on the second surface 50B of the first main body 50. The second main body 80 includes a plurality of electrodes (not illustrated) each electrically connected to one of the acoustic wave elements 31 to 33. In a state that the second main body 80 is mounted on the first main body 50, a plurality of electrodes of the second main body 80 faces the electrodes 121 to 129 of the first main body 50. Each of the plurality of electrodes of the second main body 80 is physically connected to one of the electrodes 121 to 129 by, for example, a solder bump (not illustrated).

Next, an example of the plurality of dielectric layers, the plurality of conductor layers, and the plurality of through holes constituting the first main body 50 will be described with reference to FIGS. 5A to 12. In this example, the first main body 50 includes twenty one dielectric layers stacked together. The twenty one dielectric layers are hereinafter referred to as first to twenty-first dielectric layers in the order from bottom to top. The first to twenty-first dielectric layers are denoted by reference numerals 51 to 71, respectively.

In FIGS. 5A to 12, a plurality of circles represent a plurality of through holes. Each of the dielectric layers 51 to 71 has a plurality of through holes formed. Each of the plurality of through holes is formed by filling a hole intended for a through hole with a conductive paste. Each of the plurality of through holes is connected to a terminal, a conductor layer, or another through hole.

In FIGS. 5A to 12, a plurality of specific through holes out of the plurality of through holes are denoted by reference numerals. Regarding the connection relation between each of the plurality of specific through holes and a terminal, a conductor layer, or another through hole, a connection relation in a state that the first to twenty-first dielectric layers 51 to 71 are stacked together is described.

Figure 5A:
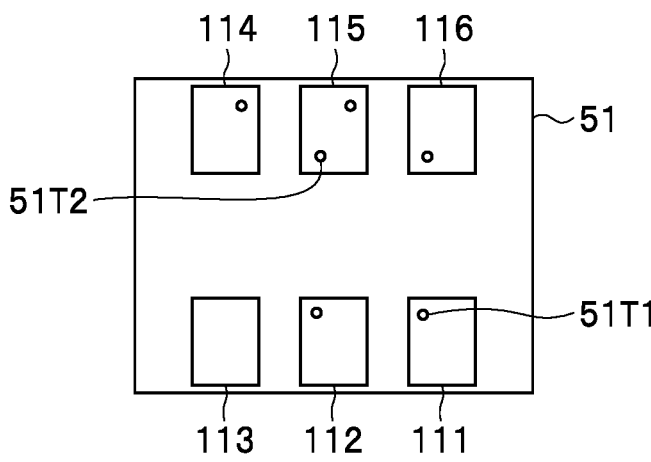
FIGS. 5A to 5C are explanatory diagrams showing respective patterned surfaces of first to third dielectric layers in the first main body in the embodiment of the present invention.

FIG. 5A shows a patterned surface of the first dielectric layer 51. The electrodes 111 to 116 are formed on the patterned surface of the dielectric layer 51. In FIG. 5A, through holes denoted by reference numerals 51T1 and 51T2 are connected to the electrodes 111 and 115, respectively. Note that, in the following description, the through hole denoted by the reference numeral 51T1 is simply referred to as a through hole 51T1. Such manner for through hole 51T1 similarly applies to through holes denoted by reference numerals other than the through hole 51T1.

Figure 5B:
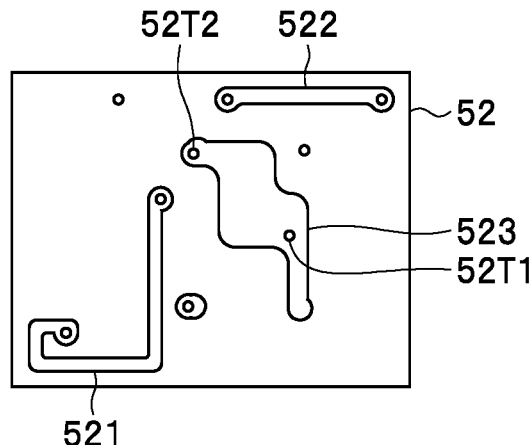

FIG. 5B shows a patterned surface of the second dielectric layer 52. Conductor layers 521 and 522 intended for inductors, and a conductor layer 523 are formed on the patterned surface of the dielectric layer 52. Through holes 52T1 and 52T2 shown in FIG. 5B, and the through holes 51T1 and 51T2 formed in the dielectric layer 51 are connected to the conductor layer 523.

Figure 5C:
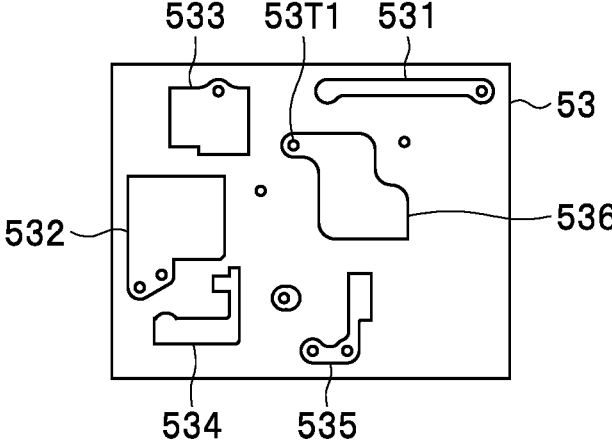

FIG. 5C shows a patterned surface of the third dielectric layer 53. A conductor layer 531 intended for an inductor, and conductor layers 532, 533, 534, 535, and 536 are formed on the patterned surface of the dielectric layer 53. A through hole 53T1 shown in FIG. 5C, and the through holes 52T1 and 52T2 formed in the dielectric layer 52 are connected to the conductor layer 536.

Figure 6A:
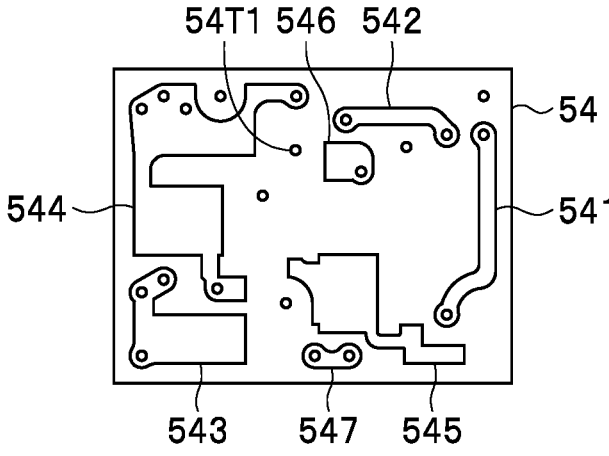
FIGS. 6A to 6C are explanatory diagrams showing respective patterned surfaces of fourth to sixth dielectric layers in the first main body in the embodiment of the present invention.

FIG. 6A shows a patterned surface of the fourth dielectric layer 54. Conductor layers 541 and 542 intended for inductors, and conductor layers 543, 544, 545, 546 and 547 are formed on the patterned surface of the dielectric layer 54. A through hole 54T1 shown in FIG. 6A is connected to the through hole 53T1 formed in the dielectric layer 53.

Figure 6B:
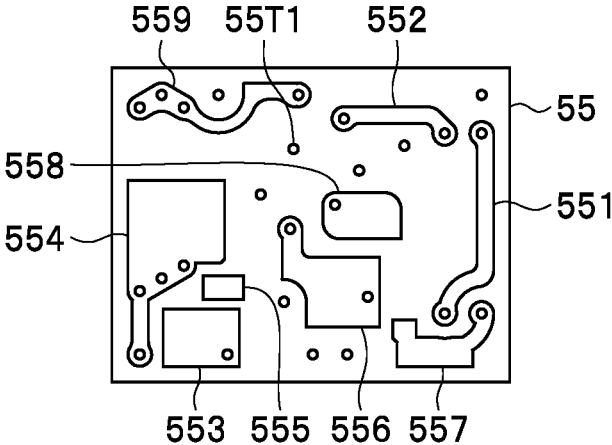

FIG. 6B shows a patterned surface of the fifth dielectric layer 55. Conductor layers 551 and 552 intended for inductors, and conductor layers 553, 554, 555, 556, 557, 558, and 559 are formed on the patterned surface of the dielectric layer 55. A through hole 55T1 shown in FIG. 6B is connected to the through hole 54T1 formed in the dielectric layer 54.

Figure 6C:
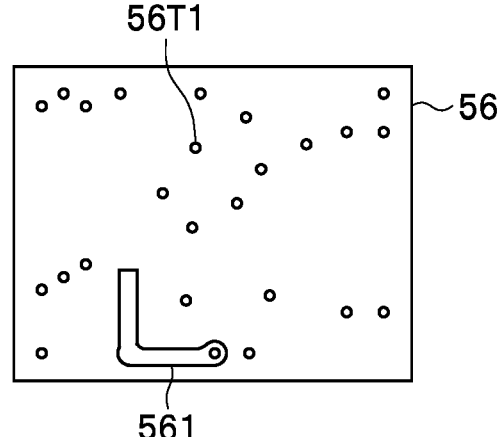

FIG. 6C shows a patterned surface of the sixth dielectric layer 56. A conductor layer 561 is formed on the patterned surface of the dielectric layer 56. A through hole 56T1 shown in FIG. 6C is connected to the through hole 55T1 formed in the dielectric layer 55.

Figure 7A:
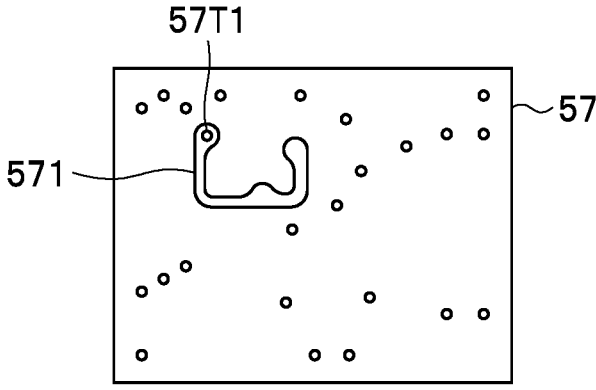
FIGS. 7A to 7C are explanatory diagrams showing respective patterned surfaces of seventh to ninth dielectric layers in the first main body in the embodiment of the present invention.

FIG. 7A shows a patterned surface of the seventh dielectric layer 57. A conductor layer 571 is formed on the patterned surface of the dielectric layer 57. A through hole 57T1 shown in FIG. 7A and the through hole 56T1 formed in the dielectric layer 56 are connected to the conductor layer 571.

Figure 7B:
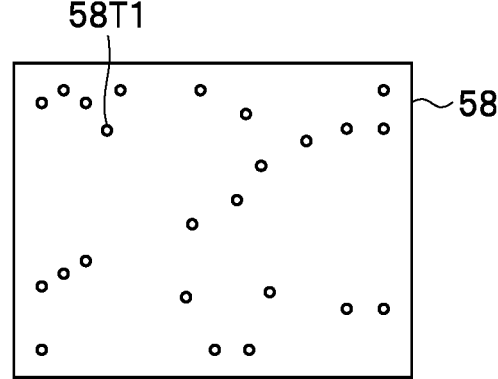

FIG. 7B shows a patterned surface of the eighth dielectric layer 58. A through hole 58T1 shown in FIG. 7B is connected to the through hole 57T1 formed in the dielectric layer 57.

Figure 7C:
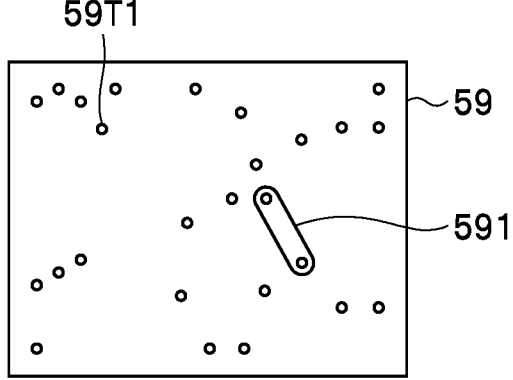

FIG. 7C shows a patterned surface of the ninth dielectric layer 59. A conductor layer 591 intended for an inductor is formed on the patterned surface of the dielectric layer 59. A through hole 59T1 shown in FIG. 7C is connected to the through hole 58T1 formed in the dielectric layer 58.

Figure 8A:
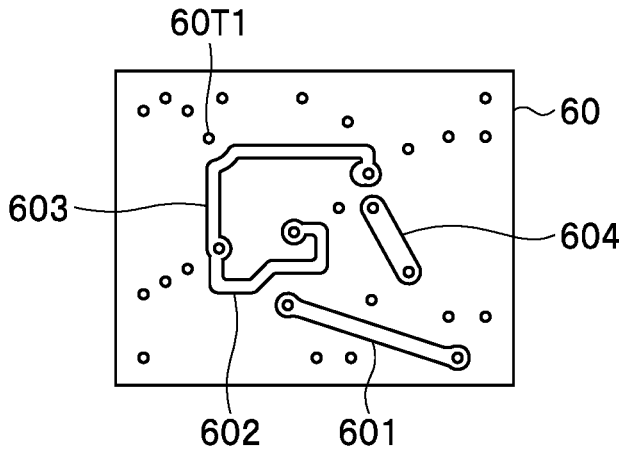
FIGS. 8A to 8C are explanatory diagrams showing respective patterned surfaces of tenth to twelfth dielectric layers in the first body in the embodiment of the present invention.

FIG. 8A shows a patterned surface of the tenth dielectric layer 60. Conductor layers 601, 602, 603, and 604 intended for inductors are formed on the patterned surface of the dielectric layer 60. The conductor layer 603 is connected to the conductor layer 602. A through hole 60T1 shown in FIG. 8A is connected to the through hole 59T1 formed in the dielectric layer 59.

Figure 8B:
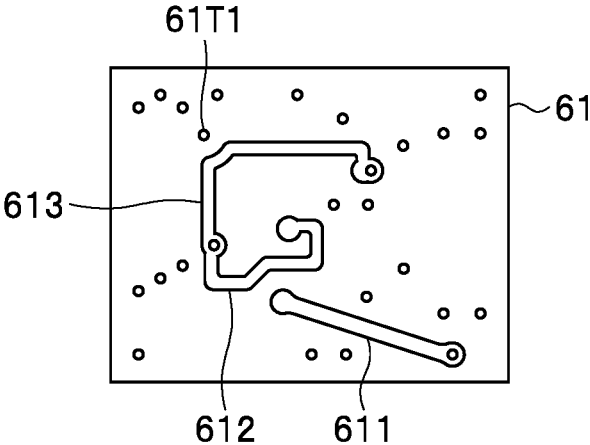

FIG. 8B shows a patterned surface of the eleventh dielectric layer 61. Conductor layers 611, 612, and 613 intended for inductors are formed on the patterned surface of the dielectric layer 61. The conductor layer 613 is connected to the conductor layer 612. A through hole 61T1 shown in FIG. 8B is connected to the through hole 60T1 formed in the dielectric layer 60.

Figure 8C:
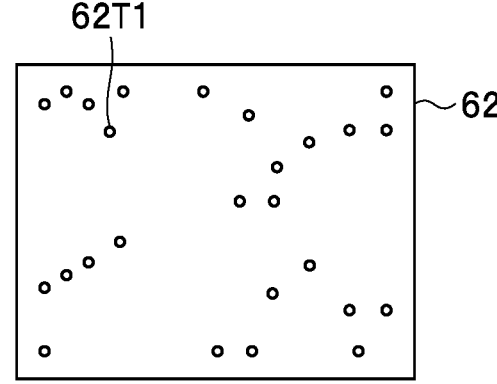

FIG. 8C shows a patterned surface of the twelfth dielectric layer 62. A through hole 62T1 shown in FIG. 8C is connected to the through hole 61T1 formed in the dielectric layer 61.

Figure 9A:
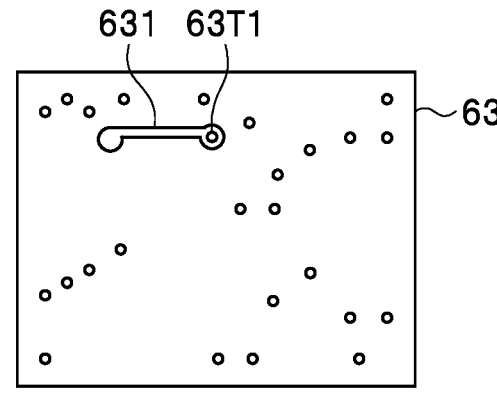
Figure 4B:
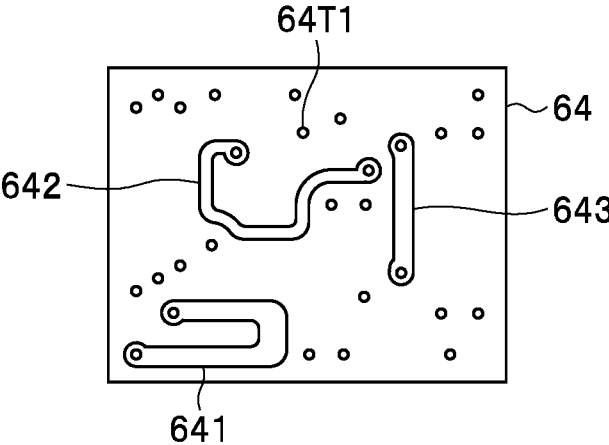

FIG. 9A shows a patterned surface of the thirteenth dielectric layer 63. A conductor layer 631 is formed on the patterned surface of the dielectric layer 63. A through hole 63T1 shown in FIG. 9A and the through hole 62T1 formed in the dielectric layer 62 are connected to the conductor layer 631.

FIG. 9B shows a patterned surface of the fourteenth dielectric layer 64. Conductor layers 641, 642, and 643 intended for inductors are formed on the patterned surface of the dielectric layer 64. A through hole 64T1 shown in FIG. 9B is connected to the through hole 63T1 formed in the dielectric layer 63.

Figure 9C:
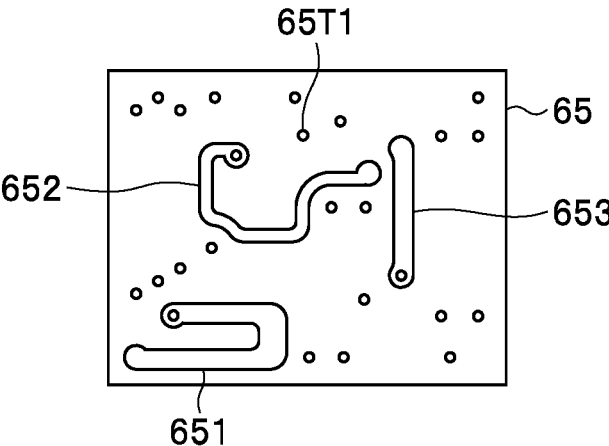

FIG. 9C shows a patterned surface of the fifteenth dielectric layer 65. Conductor layers 651, 652, and 653 intended for inductors are formed on the patterned surface of the dielectric layer 65. A through hole 65T1 shown in FIG. 9C is connected to the through hole 64T1 formed in the dielectric layer 64.

Figure 10A:
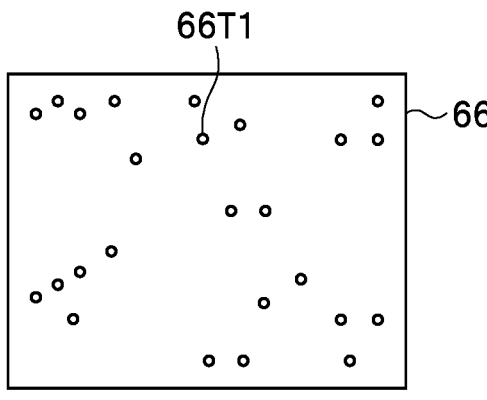
FIGS. 10A to 10C are explanatory diagrams showing respective patterned surfaces of sixteenth to eighteenth dielectric layers in the first main body in the embodiment of the present invention.

FIG. 10A shows a patterned surface of the sixteenth dielectric layer 66. A through hole 66T1 shown in FIG. 10A is connected to the through hole 65T1 formed in the dielectric layer 65.

Figure 10B:
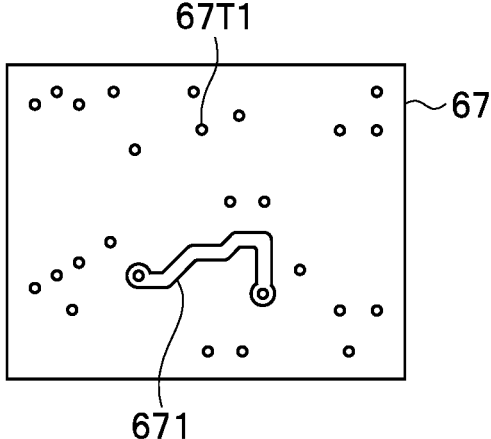

FIG. 10B shows a patterned surface of the seventeenth dielectric layer 67. A conductor layer 671 intended for an inductor is formed on the patterned surface of the dielectric layer 67. A through hole 67T1 shown in FIG. 10B is connected to the through hole 66T1 formed in the dielectric layer 66.

Figure 10C:
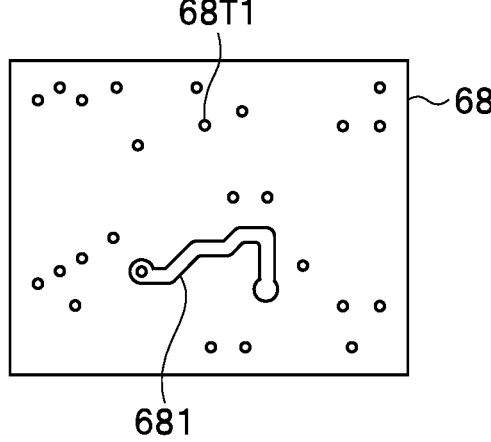

FIG. 10C shows a patterned surface of the eighteenth dielectric layer 68. A conductor layer 681 intended for an inductor is formed on the patterned surface of the dielectric layer 68. A through hole 68T1 shown in FIG. 10C is connected to the through hole 67T1 formed in the dielectric layer 67.

Figure 11A:
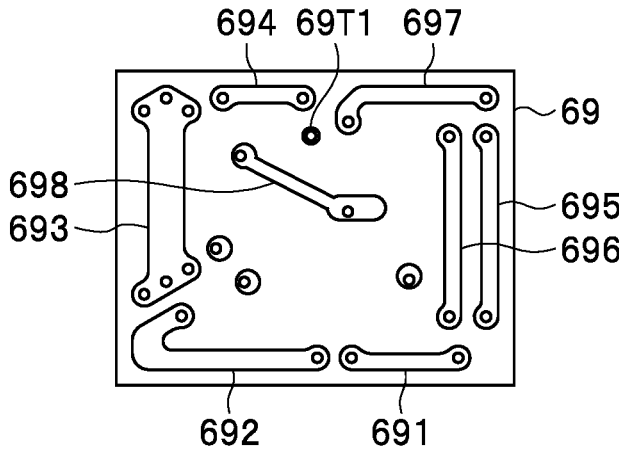
FIGS. 11A to 11C are explanatory diagrams showing respective patterned surfaces of nineteenth to twenty-first dielectric layers in the first main body in the embodiment of the present invention.

FIG. 11A shows a patterned surface of the nineteenth dielectric layer 69. Conductor layers 691, 692, 693, 694, 695, 696, 697, and 698 intended for inductors are formed on the patterned surface of the dielectric layer 69. A through hole 69T1 shown in FIG. 11A is connected to the through hole 68T1 formed in the dielectric layer 68.

Figure 11B:
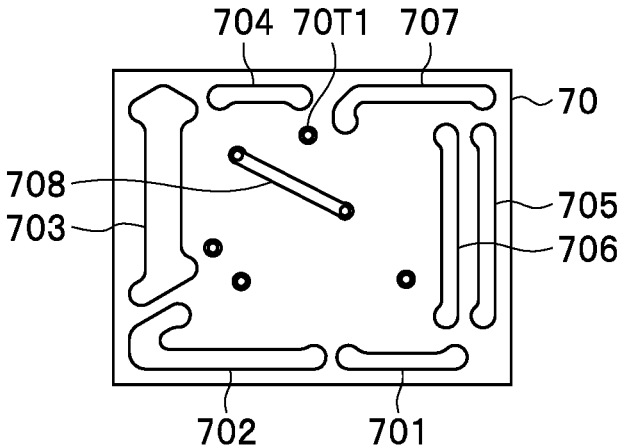

FIG. 11B shows a patterned surface of the twentieth dielectric layer 70. Conductor layers 701, 702, 703, 704, 705, 706, 707, and 708 intended for inductors are formed on the patterned surface of the dielectric layer 70. A through hole 70T1 shown in FIG. 11B is connected to the through hole 69T1 formed in the dielectric layer 69.

Figure 11C:
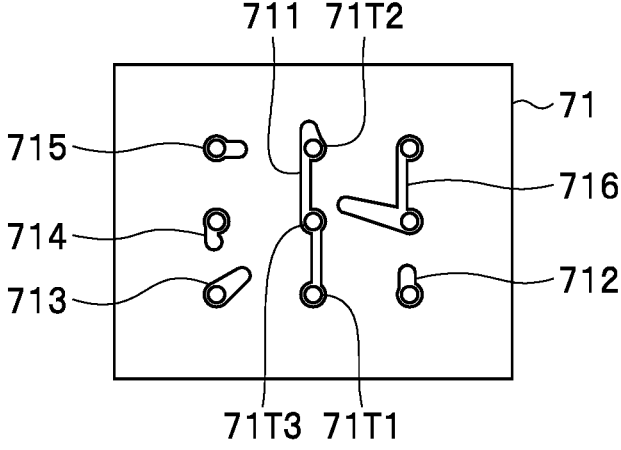

FIG. 11C shows a patterned surface of the twenty-first dielectric layer 71. Conductor layers 711, 712, 713, 714, 715, and 716 are formed on the patterned surface of the dielectric layer 71. Through holes 71T1, 71T2, and 71T3 shown in FIG. 11C, and the through hole 70T1 formed in the dielectric layer 70 are connected to the conductor layer 711.

Figure 12:
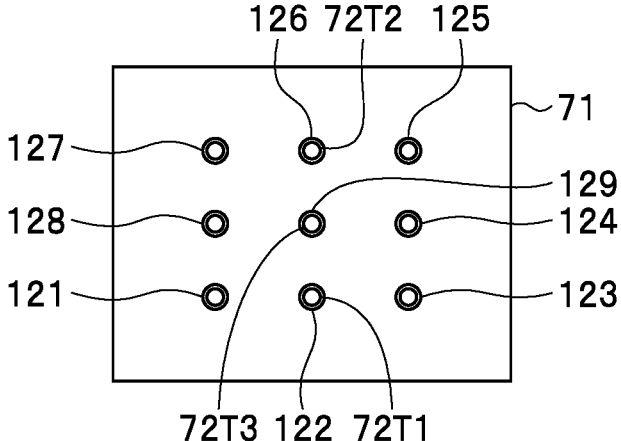
FIG. 12 is an explanatory diagram showing an electrode formation surface of the twenty-first dielectric layer in the first main body in the embodiment of the present invention.

FIG. 12 shows a surface of the twenty-first dielectric layer 71 opposite to the patterned surface thereof. The surface of the dielectric layer 71 opposite to the patterned surface thereof is hereinafter referred to as an electrode formation surface of the dielectric layer 71. The electrodes 121, 122, 123, 124, 125, 126, 127, 128, and 129 are formed on the electrode formation surface of the dielectric layer 71. The through holes 71T1, 71T2, and 71T3 formed in the dielectric layer 71 are connected to the electrodes 122, 126, and 129, respectively.

The first main body 50 includes the first to twenty-first dielectric layers 51 to 71 stacked together such that the patterned surface of the first dielectric layer 51 serves as the first surface 50A of the first main body 50 and the electrode formation surface of the twenty-first dielectric layer 71 serves as the second surface 50B of the first main body 50.

Each of the plurality of through holes shown in FIGS. 5A to 12 is connected to a conductor layer overlapping with in the stacking direction T or to another through hole overlapping with in the stacking direction T, when the first to twenty-first dielectric layers 51 to 71 are stacked together. Of the plurality of through holes shown in FIGS. 5A to 12, a through hole located within an electrode or a conductor layer is connected to the electrode or the conductor layer.

Figure 13:
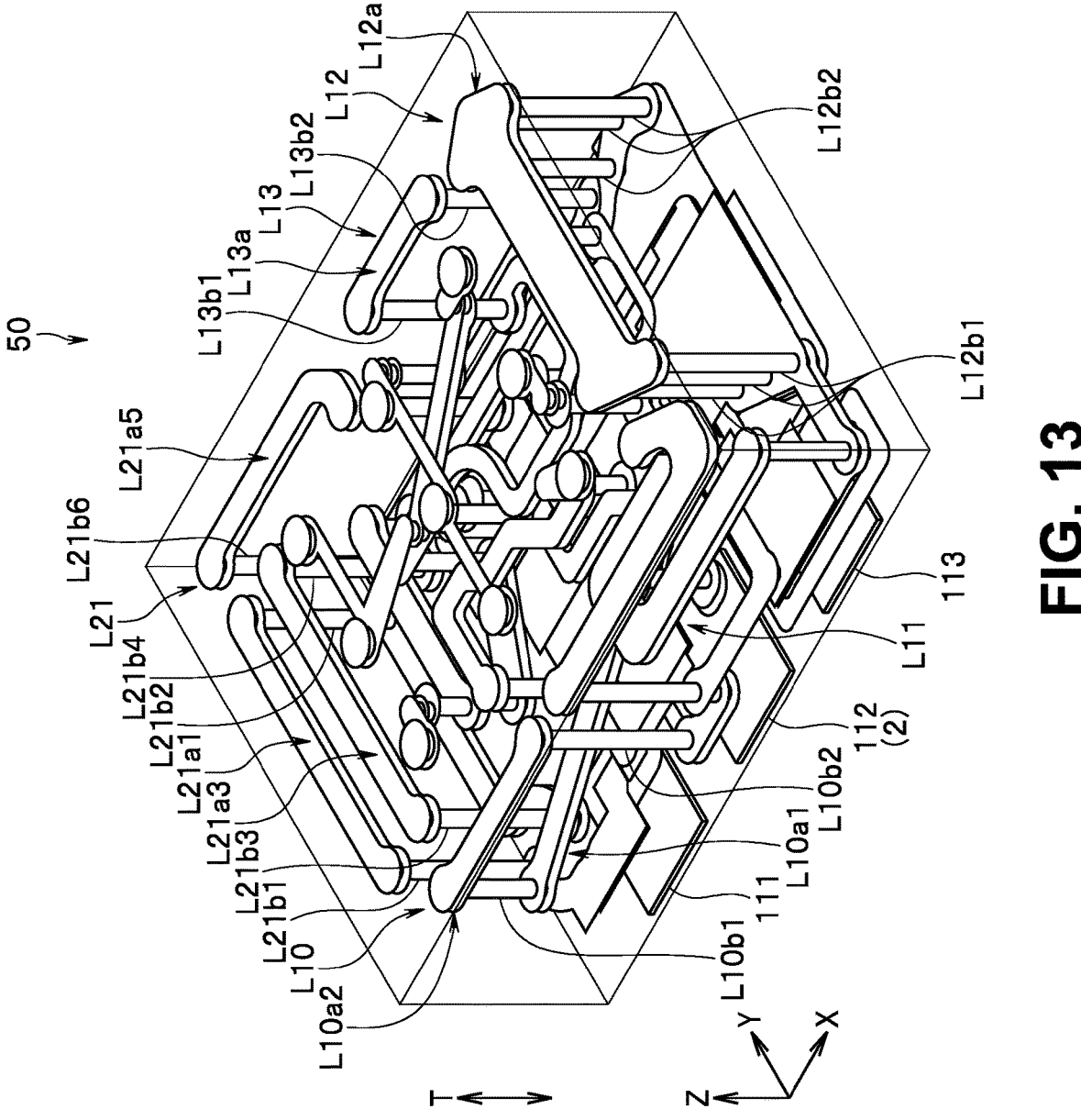
FIG. 13 is a perspective view showing inside of the first main body in the embodiment of the present invention.

FIG. 13 shows inside of the first main body 50 including the first to twenty-first dielectric layers 51 to 71 stacked together. As shown in FIG. 13, the plurality of conductor layers and the plurality of through holes shown in FIGS. 5A to 12 are stacked together inside the first main body 50.

Correspondences between the components of the circuit of the electronic component 1 shown in FIG. 1 and the components inside the first main body 50 shown in FIGS. 5A to 12 will be described below. First, the inductor L10 will be described. The inductor L10 includes the conductor layers 601, 611, 691, and 701 intended for inductors, a plurality of through holes including one connecting a pair of the conductor layers 601 and 611, one connecting a pair of the conductor layers 611 and 691, and one connecting a pair of the conductor layers 691 and 701, and a plurality of through holes connecting the conductor layer 691 and the conductor layer 547.

Next, the first filter 10 will be described. The inductor L11 includes the conductor layers 641, 651, 692, and 702 intended for inductors, and a plurality of through holes including one connecting a pair of the conductor layers 641 and 651, one connecting a pair of the conductor layers 651 and 692, and one connecting a pair of the conductor layers 692 and 702.

The inductor L12 includes the conductor layers 693 and 703 intended for an inductor, a plurality of through holes connecting the conductor layers 693 and 703, a plurality of through holes connecting the conductor layers 693 and 554, and a plurality of through holes connecting the conductor layers 693 and 559.

The inductor L13 includes the conductor layers 694 and 704 intended for an inductor, a plurality of through holes connecting the conductor layers 694 and 704, a plurality of through holes connecting the conductor layers 694 and 554, and a plurality of through holes connecting the conductor layers 694 and 559.

The inductor L14 includes a part of each of the conductor layers 543 and 554. The inductor L15 includes a part of the conductor layer 544. The inductor L16 includes the conductor layer 521 intended for an inductor.

The capacitor C11 includes the conductor layers 543 and 553, and the dielectric layer 54 interposed between these conductor layers. The capacitor C12 includes the conductor layers 532, 544, and 554, and the dielectric layers 53 and 54 each interposed between these conductor layers. The capacitor C13 includes the conductor layers 533 and 544, and the dielectric layer 53 interposed between these conductor layers.

The capacitor C14 includes the conductor layers 555 and 561, and the dielectric layer 55 interposed between these conductor layers. The capacitor C15 includes the conductor layers 534 and 543, and the dielectric layer 53 interposed between these conductor layers. The capacitor C16 includes the conductor layers 534 and 544, and the dielectric layer 53 interposed between these conductor layers. The capacitor C17 is floating capacitance generated between the electrode 113 and the conductor layer 534.

Next, the high-pass filter circuit 21 of the second filter 20 will be described. The inductor L21 includes the conductor layers 522, 531, 541, 542, 551, 552, 695, 696, 697, 705, 706, and 707 intended for inductors, a plurality of through holes including one connecting a pair of the conductor layers 522 and 531, one connecting a pair of the conductor layers 541 and 551, one connecting a pair of the conductor layers 542 and 552, one connecting a pair of the conductor layers 695 and 705, one connecting a pair of the conductor layers 696 and 706, one connecting a pair of the conductor layers 697 and 707, one connecting a pair of the conductor layers 551 and 695, one connecting a pair of the conductor layers 551 and 696, one connecting a pair of the conductor layers 552 and 696, one connecting a pair of the conductor layers 552 and 697, and one connecting a pair of the conductor layers 531 and 697, and a plurality of through holes connecting the conductor layer 695 and the conductor layer 557.

The capacitor C21 includes the conductor layers 535 and 545, and the dielectric layer 53 interposed between these conductor layers. The capacitor C22 includes the conductor layers 545 and 556, and the dielectric layer 54 interposed between these conductor layers. The capacitor C23 includes the conductor layers 545 and 557, and the dielectric layer 54 interposed between these conductor layers.

The capacitor C24 corresponds to a total of floating capacitance generated between the conductor layers 551 and 557, floating capacitance generated between the conductor layers 695 and 696, and floating capacitance generated between the conductor layers 705 and 706.

Next, a part other than the high-pass filter circuit 21 of the second filter 20 will be described. The acoustic wave element 31 is provided between the electrodes 123 and 124. The acoustic wave element 32 is provided between the electrodes 124 and 125. The acoustic wave element 33 is provided between the electrodes 121 and 128.

The inductor L22 includes the conductor layers 602 and 612 intended for an inductor and a plurality of through holes connecting the conductor layer 602 and the conductor layer 612. The inductor L23 includes the conductor layers 603 and 613 intended for an inductor and a plurality of through holes connecting the conductor layer 602 and the conductor layer 612. The inductor L24 includes the conductor layers 642 and 652 intended for an inductor and a plurality of through holes connecting the conductor layer 642 and the conductor layer 652.

The inductor L25 includes the conductor layers 698 and 708 intended for an inductor and a plurality of through holes connecting the conductor layer 698 and the conductor layer 708. The inductor L26 includes the conductor layers 591 and 604 intended for an inductor and a plurality of through holes connecting the conductor layer 591 and the conductor layer 604. The inductor L27 includes the conductor layers 643 and

653 intended for an inductor and a plurality of through holes connecting the conductor layer 643 and the conductor layer 653.

The inductor L28 includes the conductor layers 671 and 681 intended for an inductor and a plurality of through holes connecting the conductor layer 671 and the conductor layer 681. The inductor L29 includes a plurality of through holes connecting the conductor layers 612 and 613 and the conductor layer 714, and one through hole connecting the conductor layer 714 and the electrode 124.

The inductor L30 includes a plurality of through holes connecting the conductor layer 546 and the conductor layer 603. The inductor L31 includes a plurality of through holes connecting the conductor layer 558 and the conductor layer 698.

The capacitor C25 includes the conductor layers 523 and 536, and the dielectric layer 52 interposed between these conductor layers. The capacitor C26 includes the conductor layers 536 and 558, and the dielectric layers 53 and 54 each interposed between these conductor layers. The capacitor C27 includes the electrode 116, the conductor layer 522, and the dielectric layer 51 interposed between the electrode 116 and the conductor layer 522.

Figure 14:
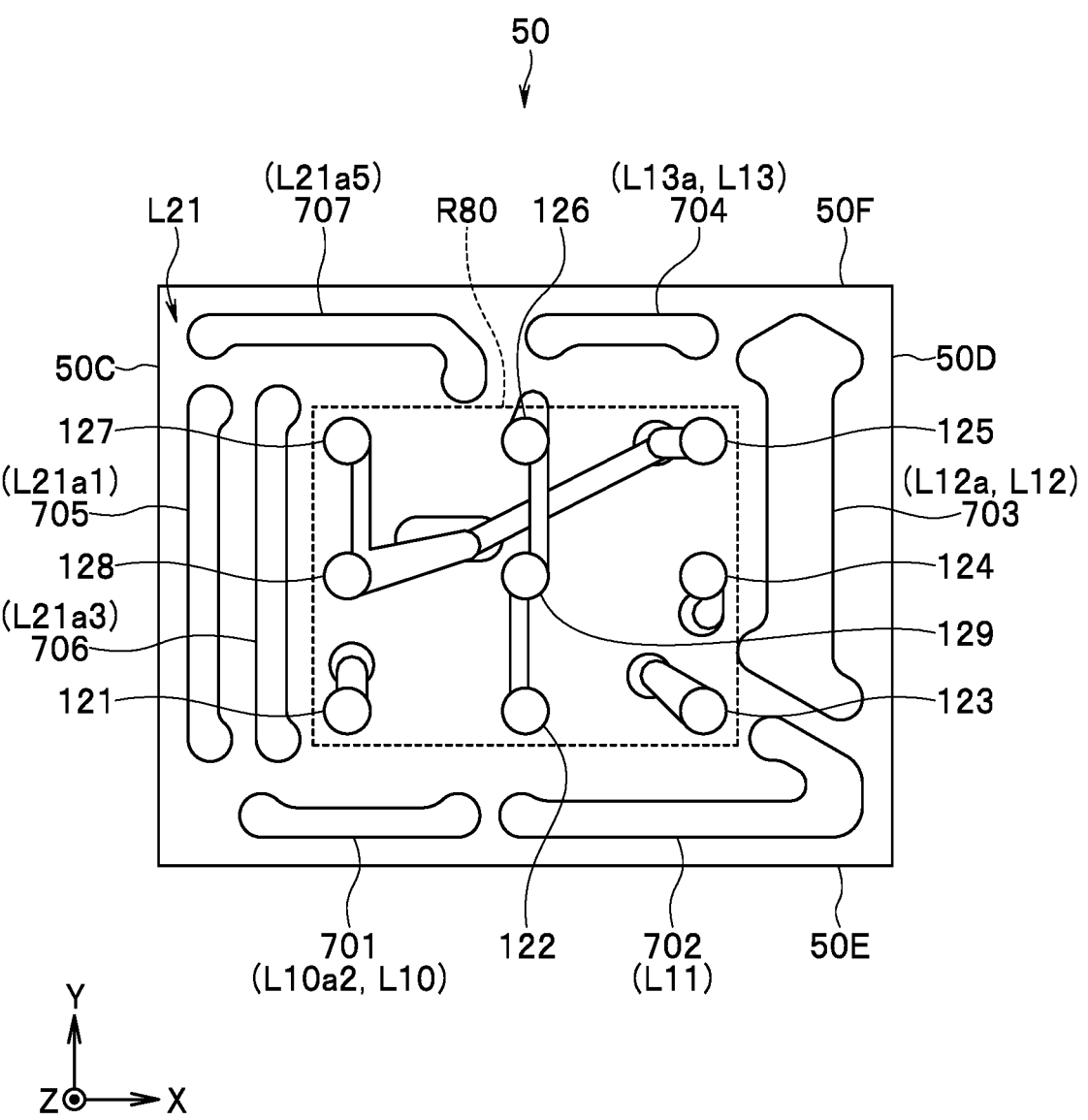
FIG. 14 is a plan view showing a part of inside of the first main body in the embodiment of the present invention.
Figure 15:
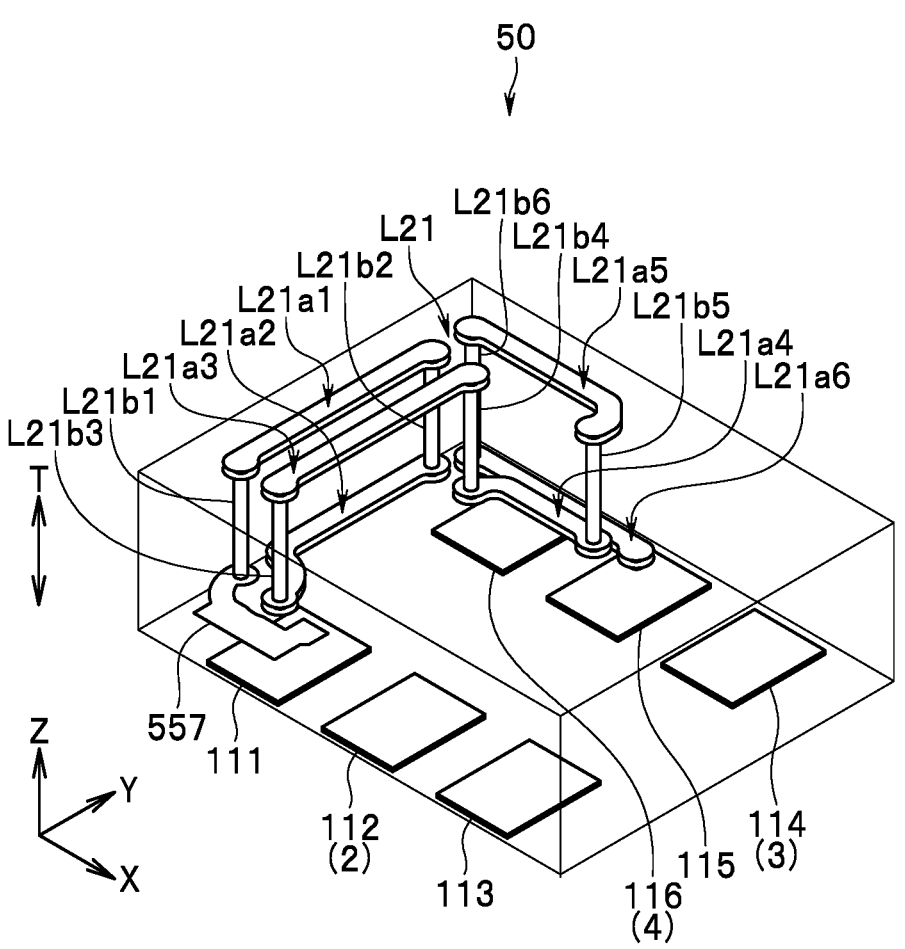
FIG. 15 is a perspective view showing a part of inside of the first main body in the embodiment of the present invention.
Figure 16:
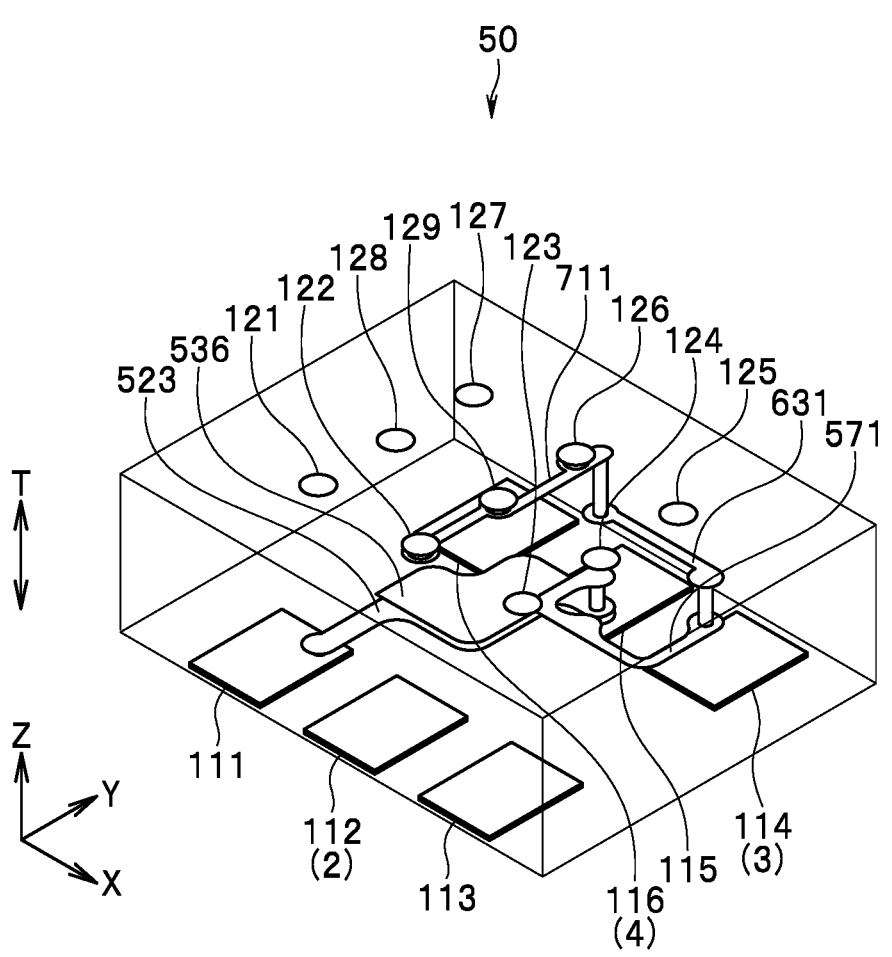
FIG. 16 is a perspective view showing a part of inside of the first main body in the embodiment of the present invention.

Next, structural features of the electronic component 1 according to the present embodiment will be described with reference to FIGS. 2 to 16. FIG. 14 is a plan view showing a part of inside of the first main body 50. FIGS. 15 and 16 are each a perspective view showing a part of inside of the first main body 50.

The inductor L11 is an inductor wound about an axis extending in a direction parallel to the stacking direction T. In other words, each of the conductor layers 641, 651, 692, and 702 constituting the inductor L11 is wound about an axis extending in the direction parallel to the stacking direction T.

Each of the inductors L10, L12, L13, and L21 is an inductor of conductor structure type wound about an axis extending in a direction orthogonal to the stacking direction T. Here, a columnar structure including a plurality of through holes connected in series is referred to as a columnar conductor. The columnar conductor extends in the direction parallel to the stacking direction T. The inductor of conductor structure type includes at least one conductor layer and a plurality of columnar conductors.

Each of the inductors L10, L12, L13, and L21 is also a winding having a rectangular shape or substantially rectangular shape. For the winding having the rectangular shape or substantially rectangular shape, when the winding is considered to be a rectangle, the number of times of winding may be ¼ times per one side of the rectangle.

The number of times of winding for the inductor L10 is one time. As shown in FIG. 13, the inductor L10 includes a conductor layer part L10a1, a columnar conductor L10b1 connected to the conductor layer part L10a1, a conductor layer part L10a2 connected to the columnar conductor L10b1, and a columnar conductor L10b2 connected to the conductor layer part L10a2. The conductor layer part L10a1 includes the conductor layers 601 and 611. The conductor layer part L10a2 includes the conductor layers 691 and 701.

The number of times of winding for the inductor L12 is ¾ times. As shown in FIG. 13, the inductor L12 includes three columnar conductors L12b1, a conductor layer part L12a connected to the three columnar conductors L12b1, and three columnar conductors L12b2 connected to the conductor layer part L12a. The conductor layer part L12a includes the conductor layers 693 and 703.

The number of times of winding for the inductor L13 is ¾ times. As shown in FIG. 13, the inductor L13 includes a columnar conductor L13b1, a conductor layer part L13a connected to the columnar conductor L13b1, and a columnar conductor L13b2 connected to the conductor layer part L13a. The conductor layer part L13a includes the conductor layers 694 and 704.

The number of times of winding for the inductor L21 is three times. As shown in FIGS. 13 and 14, the inductor L21 includes a columnar conductor L21b1, a conductor layer part L21a1 connected to the columnar conductor L21b1, a columnar conductor L21b2 connected to the conductor layer part L21a1, a conductor layer part L21a2 connected to the columnar conductor L21b2, a columnar conductor L21b3 connected to the conductor layer part L21a2, a conductor layer part L21a3 connected to the columnar conductor L21b3, a columnar conductor L21b4 connected to the conductor layer part L21a3, a conductor layer part L21a4 connected to the columnar conductor L21b4, a columnar conductor L21b5 connected to the conductor layer part L21a4, a conductor layer part L21a5 connected to the columnar conductor L21b5, a columnar conductor L21b6 connected to the conductor layer part L21a5, and a conductor layer part L21a6 connected to the columnar conductor L21b6.

The conductor layer part L21a1 includes the conductor layers 695 and 705. The conductor layer part L21a2 includes the conductor layers 541 and 551. The conductor layer part L21a3 includes the conductor layers 696 and 706. The conductor layer part L21a4 includes the conductor layers 542 and 552. The conductor layer part L21a5 includes the conductor layers 697 and 707. The conductor layer part L21a6 includes the conductor layers 522 and 532.

Next, concerning the inductors L10, L12, L13, and L21 of conductor structure type, structural features of the electronic component 1 according to the present embodiment will be described further in detail. The first main body 50 includes the common terminal 2, the first signal terminal 3, the second signal terminal 4, and the inductors L10, L12, L13, and L21. The inductors L10, L12, L13, and L21 are integrated with the first main body 50. The inductor L10 is provided between the common terminal 2 and the first and second signal terminals 3 and 4, in the circuit configuration. The inductors L12 and L13 are provided between the common terminal 2 and the first signal terminal 3, in the circuit configuration. The inductor L21 is provided between the common terminal 2 and the second signal terminal 4, in the circuit configuration.

The second main body 80 includes the acoustic wave elements 31 to 33. The acoustic wave elements 31 to 33 are provided between the common terminal 2 and the second signal terminal 4, in the circuit configuration.

In FIG. 14, a region surrounded by a dashed line denoted by a reference numeral R80 shows a mounting region for the second main body 80 to be mounted on. The second surface 50B of the first main body 50 includes the mounting region R80. The electrodes 121 to 129 provided on the second surface 50B are arranged within the mounting region R80. A planar shape of the second main body 80 (shape when seen in the stacking direction T) may be the same as the shape of the mounting region R80. Alternatively, the second main body 80 may include a first part having a planar shape the same as that of the mounting region R80 and a second part having a planar shape larger than the shape of the mounting region R80. In this case, the second main body 80 is mounted on the first main body 50, in a posture where the first part is located between the first main body 50 and the second part.

In a state that the second main body 80 is mounted on the first main body 50, the inductors L10, L12, L13, and L21 are arranged surrounding at least a part of the second main body 80, when seen in the stacking direction T. In the present embodiment in particular, a plurality of components of the inductors L10, L12, L13, and L21 except the conductor layer part L10a1 of the inductor L10 are arranged surrounding the mounting region R80, when seen in the stacking direction T. In other words, the entirety of each of the inductors L12, L13, and L21 is not overlapping with the mounting region R80, when seen in the stacking direction T. A plurality of columnar conductors included in each of the inductors L10, L12, L13, and L21 are not overlapping with the mounting region R80, when seen in the stacking direction T. In contrast, a part of the conductor layer part L10a1 of the inductor L10 is overlapping with the mounting region R80, when seen in the stacking direction T. Accordingly, in the present embodiment, the inductors L10, L12, L13, and L21 are arranged surrounding a part of the second main body 80, when seen in the stacking direction T.

As shown in FIG. 14, the conductor layer part L10a2 (conductor layers 691 and 701) of the inductor L10 is arranged between the mounting region R80 and the side surface 50E and extends along the side surface 50E, when seen in the stacking direction T. In the present embodiment in particular, the conductor layer part L10a2 mostly extends in a direction parallel to the X direction. No conductor is provided between the conductor layer part L10a2 and the side surface 50E.

As shown in FIG. 14, the conductor layer part L12a (conductor layers 693 and 703) of the inductor L12 is arranged between the mounting region R80 and the side surface 50D and extends along the side surface 50D, when seen in the stacking direction T. In the present embodiment in particular, the conductor layer part L12a mostly extends in a direction parallel to the Y direction. No conductor is provided between the conductor layer part L12a (conductor layers 693 and 703) and the side surface 50D.

As shown in FIG. 14, the conductor layer part L13a (conductor layers 694 and 704) of the inductor L13 is arranged between the mounting region R80 and the side surface 50F and extends in the direction parallel to the X direction along the side surface 50F, when seen in the stacking direction T. In the present embodiment in particular, the conductor layer part L13a mostly extends in the direction parallel to the X direction. No conductor is provided between the conductor layer part L13a and the side surface 50F.

As shown in FIG. 14, each of the conductor layer part L21a1 (conductor layers 695 and 705) and the conductor layer part L21a3 (conductor layers 696 and 706) of the inductor L21 is arranged between the mounting region R80 and the side surface 50C and extending along the side surface 50C, when seen in the stacking direction T. In the present embodiment in particular, each of the conductor layer parts L21a1 and L21a3 mostly extends in the direction parallel to the Y direction. No conductor is provided between the conductor layer part L21a1 and the side surface 50C. The conductor layer part L21a3 is arranged at a position where the conductor layer part L21a3 and the side surface 50C sandwiches the conductor layer part L21a1.

As shown in FIG. 14, the conductor layer part L21a5 (conductor layers 697 and 707) of the inductor L21 is arranged between the mounting region R80 and the side surface 50F and extends along the side surface 50F, when seen in the stacking direction T. In the present embodiment in particular, the conductor layer part L21a5 mostly extends in the direction parallel to the X direction. No conductor is provided between the conductor layer part L21a5 and the side surface 50F.

The conductor layer part L21a2 (conductor layers 541 and 551) of the inductor L21 shown in FIG. 15 is arranged between the mounting region R80 and the side surface 50C and extending along the side surface 50C, when seen in the stacking direction T. In the present embodiment in particular, the conductor layer part L21a2 mostly extends in the direction parallel to the Y direction.

Each of the conductor layer part L21a4 (conductor layers 542 and 552) and the conductor layer part L21a6 (conductor layers 522 and 532) of the inductor L21 shown in FIG. 15 is arranged between the mounting region R80 and the side surface 50F and extends along the side surface 50F, when seen in the stacking direction T. In the present embodiment in particular, each of the conductor layer parts L21a4 and L21a6 mostly extends in the direction parallel to the X direction. No conductor is provided between the conductor layer part L21a6 and the side surface 50F. The conductor layer part L21a4 is arranged at a position where the conductor layer part L21a4 and the side surface 50F sandwiches the conductor layer part L21a6, when seen in the stacking direction T.

The first main body 50 further includes the first filter 10 provided between the common terminal 2 and the first signal terminal 3 in the circuit configuration and the second filter 20 that is provided between the common terminal 2 and the second signal terminal 4 in the circuit configuration and that includes the acoustic wave elements 31 to 33. The first filter 10 includes the inductors L12 and L13 of conductor structure type. The second filter includes the inductor L21 of conductor structure type.

In a state that the second main body 80 is mounted on the first main body 50, the second main body 80 overlaps with a part of the second filter 20, when seen in the stacking direction T. The second filter 20 includes the inductor L21 not overlapping with the second main body 80 when seen in the stacking direction T and the inductors L22 to L31 overlapping with the second main body 80 when seen in the stacking direction T. As shown in FIG. 1, in the circuit configuration, the inductor L21 is provided at a position further from the acoustic wave elements 31 to 33 than the inductors L22 to L31.

Each of the inductors L22 to L29 is a planar inductor extending along a plane intersecting with the stacking direction T. The planar inductor is an inductor that has no columnar conductor as a component, the inductor not wound about an axis extending in a direction orthogonal to the stacking direction T. The planar inductor may be or may not be wound about an axis extending in the direction parallel to the stacking direction T.

The inductor L10 includes the conductor layer 701 closest to the second surface 50B, in other words, the second main body 80. The inductor L12 includes the conductor layer 703 closest to the second surface 50B. The inductor L13 includes the conductor layer 704 closest to the second surface 50B. The inductor L21 includes the conductor layers 705 to 707 closest to the second surface 50B. Each of the inductors L22 to L29 is arranged at a position further from the second surface 50B, in other words, the second main body 80, than the conductor layers 701 and 703 to 707.

Each of the inductors L30 and L31 is a columnar inductor extending along the stacking direction T. The columnar inductor is an inductor that has a columnar conductor as a component and that has no conductor layer as a component, the inductor not wound about an axis extending in a direction orthogonal to the stacking direction T.

Next, features of the inductor L21 will be described in detail with reference to FIG. 15. As described above, the inductor L21 includes the columnar conductors L21b1 to L21b6. The columnar conductors L21b1 and L21b3 are adjacent to each other. Currents in the columnar conductors L21b1 and L21b3 flow in the same direction. Specifically, each of the columnar conductors L21b1 and L21b3 includes a first end portion closest to the first surface 50A and a second end portion closest to the second surface 50B. The first end portion of the columnar conductor L21b1 is, in the circuit configuration, at a position further from the ground than the second end portion of the columnar conductor L21b1. The first end portion of the columnar conductor L21b3 is, in the circuit configuration, at a position further from the ground than the second end portion of the columnar conductor L21b3.

The columnar conductors L21b2, L21b4, and L21b6 are adjacent to each other. Currents in the columnar conductors L21b2, L21b4, and L21b6 flow in the same direction. Specifically, each of the columnar conductors L21b2, L21b4, and L21b6 includes a first end portion closest to the first surface 50A and a second end portion closest to the second surface 50B. The first end portion of the columnar conductor L21b2 is, in the circuit configuration, at a position closer to the ground than the second end portion of the columnar conductor L21b2. The first end portion of the columnar conductor L21b4 is, in the circuit configuration, at a position closer to the ground than the second end portion of the columnar conductor L21b4. The first end portion of the columnar conductor L21b6 is, in the circuit configuration, at a position closer to the ground than the second end portion of the columnar conductor L21b6.

The inductor L21 further includes the conductor layer 695 connected to the second end portion of each of the columnar conductors L21b1 and L21b2, the conductor layer 696 connected to the second end portion of each of the columnar conductors L21b3 and L21b4, and the conductor layer 697 connected to the second end portion of each of the columnar conductors L21b5 and L21b6. A longitudinal direction of the conductor layer 695 and a longitudinal direction of the conductor layer 697 are intersecting with each other. An angle formed by the longitudinal direction of the conductor layer 695 and the longitudinal direction of the conductor layer 697 is preferably at an angle of 70° or more and 110° or less, in a viewpoint such that each of the conductor layers 695 and 697 does not overlap with the mounting region R80 when seen in the stacking direction T and for the mounting region R80 to have a large area.

The conductor layer 696 is arranged at a position where the conductor layer 696 and the side surface 50C sandwich the conductor layer 695. In the present embodiment in particular, the longitudinal direction of the conductor layer 695 and the longitudinal direction of the conductor layer 696 are parallel to or substantially parallel to each other. The longitudinal direction of the conductor layer 696 and the longitudinal direction of the conductor layer 697 are intersecting with each other. An angle formed by the longitudinal direction of the conductor layer 696 and the longitudinal direction of the conductor layer 697 is preferably 70° or more and 110° or less.

The shape and arrangement of the conductor layers 705, 706, and 707 are the same or substantially the same as the shape and arrangement of the conductor layers 695, 696, and 697, respectively, except the position in the stacking direction T. The above description on the conductor layers 695, 696, and 697 also applies to the conductor layers 705, 706, and 707.

Next, other features of the electronic component 1 according to the present embodiment will be described with reference to FIG. 16. FIG. 16 shows the conductor layers 523, 536, 571, 631, and 711, and the through holes 51T1, 51T2, 52T1, 52T2, 53T1, 54T1, 55T1, 56T1, 57T1, 58T1, 59T1, 60T1, 61T1, 62T1, 63T1, 64T1, 65T1, 66T1, 67T1, 68T1, 69T1, 70T1, and 72T1 to 72T3. These conductor layers and through holes are electrically connected to each other, constituting a ground conductor.

The ground conductor electrically connects the electrodes 122, 126, and 129 among the electrodes 121 to 129 used for electrical connection between the first main body 50 and the second main body 80 to the electrodes 111 and 115 connected to the ground. In the first main body 50, the ground conductor is provided passing between a plurality of conductors constituting the first filter 10 and a plurality of conductors constituting the second filter 20.

Figure 17:
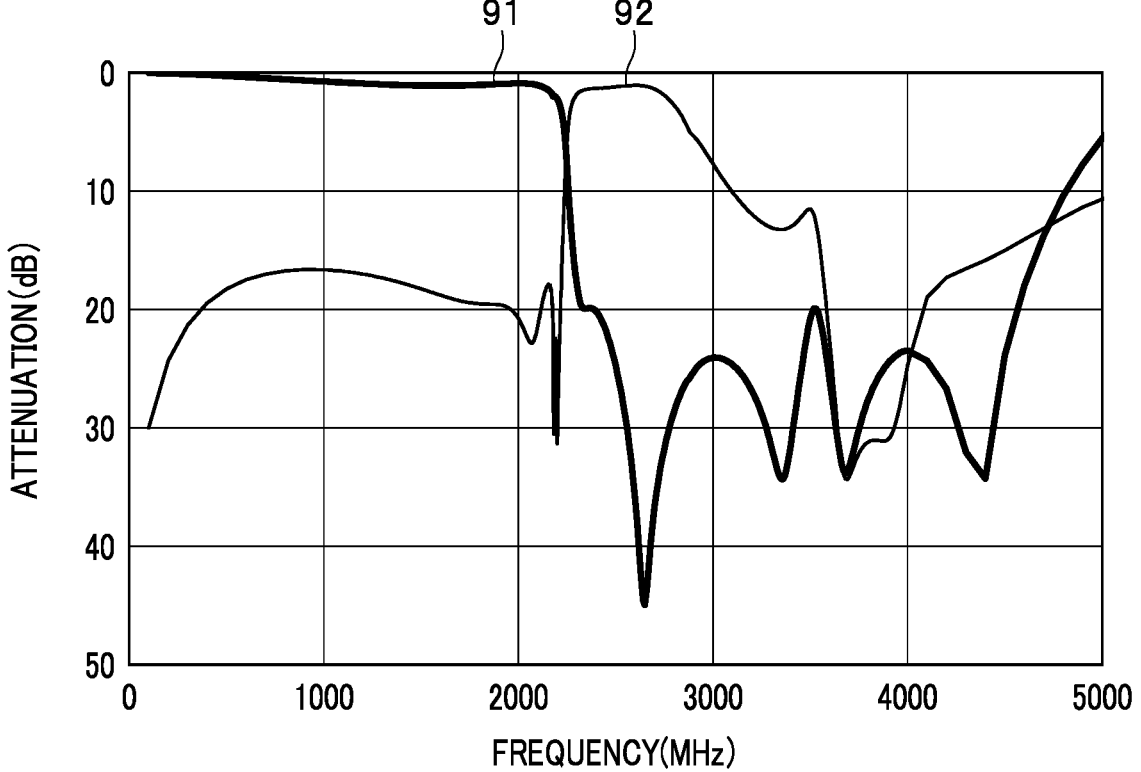
FIG. 17 is a characteristic chart showing an example of a characteristic of the electronic component according to the embodiment of the present invention.

Next, an example of characteristics of the electronic component 1 according to the present embodiment will be described. FIG. 17 is a characteristic chart showing the pass attenuation characteristics of the electronic component 1. In FIG. 17, the horizontal axis indicates frequency and the vertical axis indicates attenuation. In FIG. 17, a curve denoted by a reference numeral 91 indicates a pass attenuation characteristic between the common terminal 2 and the first signal terminal 3, in other words, a pass attenuation characteristic of the first filter 10. In FIG. 17, a curve denoted by a reference numeral 92 indicates a pass attenuation characteristic between the common terminal 2 and the second signal terminal 4, in other words, a pass attenuation characteristic of the second filter 20.

Now, the operation and effects of the electronic component 1 according to the present embodiment will be described. In the present embodiment, the first main body 50 includes the first filter 10 and the second filter 20, and the second main body 80 includes the acoustic wave elements 31 to 33.

Here, it is considered that a second main body of a comparative example including an acoustic wave element having one end connected to the ground is mounted on the first main body 50. In this case, the acoustic wave element is connected, via inside of the first main body 50, to an electrode that is provided on the first surface 50A of the first main body 50 and that is connected to the ground. The path from the acoustic wave element to the electrode is relatively long, so that the floating inductance caused by a conductor constituting the path is increased, causing adjustment to achieve a desired characteristic to be difficult.

In contrast, in the present embodiment, each of the acoustic wave elements 31 to 33, in a state of being electrically connected to the circuit section of the first main body 50, in other words, the circuit section of the second filter 20, is not electrically connected to the ground. Thus, according to the present embodiment, it is possible to decrease the floating inductance caused by a conductor connected to each of the acoustic wave elements 31 to 33. As a result, a desired characteristic can be easily achieved.

In the present embodiment, the circuit section of the second filter 20 includes the capacitors C25 to C27 that are each a capacitor provided between both ends of one of the acoustic wave elements 31 to 33 and the ground and that each interrupts a conductor connecting both ends of one of the acoustic wave elements 31 to 33 and the ground. The capacitors C25 to C27 each have a function of adjusting impedance, a function of adjusting a frequency of an attenuation pole, and a function of adjusting how large the attenuation pole is. According to the present embodiment, it is possible to achieve a desired characteristic by the capacitors C25 to C27.

In the present embodiment, with the acoustic wave elements 31 to 33, a characteristic can be achieved in which insertion loss (attenuation) changes abruptly in a frequency domain close to the second passband, in pass attenuation characteristics of the second filter 20. As shown in FIG. 17, in the present embodiment in particular, the insertion loss (attenuation) is abruptly changed in a frequency domain lower than the second passband.

In the present embodiment, the first filter 10 includes the inductors L12 and L13 of conductor structure type. In the present embodiment in particular, the inductor L12 includes three columnar conductors L12b1, a conductor layer part L12a connected to the three columnar conductors L12b1, and three columnar conductors L12b2 connected to the conductor layer part L12a. Thus, according to the present embodiment, the Q value of each of the inductors L11 and L12 can be increased, and a characteristic can be achieved in which insertion loss (attenuation) changes abruptly in a frequency domain close to the first passband, in pass attenuation characteristics of the first filter 10.

Now, other effects of the electronic component 1 according to the present embodiment will be described. In the present embodiment, the inductors L10, L12, L13, and L21 of conductor structure type are arranged surrounding at least a part of the second main body 80. In the present embodiment in particular, the entirety of each of the inductors L12, L13, and L21 does not overlap with the mounting region R80, when seen in the stacking direction T. The plurality of columnar conductors included in each of the inductors L10, L12, L13, and L21 does not overlap with the mounting region R80, when seen in the stacking direction T. Thus, according to the present embodiment, the mounting region R80 can be prevented from being deformed by the plurality of columnar conductors. As a result, according to the present embodiment, the mounting region R80 can be flat.

In the present embodiment, the inductors L11 to L13 of the first filter 10 are arranged surrounding at least a part of the second main body 80, when seen in the stacking direction T. Thus, according to the present embodiment, it is possible to suppress coupling between the inductors L11 to L13 and the acoustic wave elements 31 to 33 as compared with a case where the inductors L11 to L13 are arranged overlapping with the second main body 80 when seen in the stacking direction T. As a result, according to the present embodiment, it is possible to provide high isolation between the first filter 10 and the second filter 20.

In the present embodiment, in the first main body 50, the ground conductor is provided passing between the plurality of conductors constituting the first filter 10 and the plurality of conductors constituting the second filter 20. This also allows high isolation between the first filter 10 and the second filter 20.

In the present embodiment, the second filter 20 includes the inductor L21 not overlapping with the second main body 80 when seen in the stacking direction T and the inductors L22 to L31 overlapping with the second main body 80 when seen in the stacking direction T. In the present embodiment in particular, the inductor L21 is a component of the high-pass filter circuit 21. According to the present embodiment, in the circuit configuration, the inductor L21 is provided at a position further from the acoustic wave elements 31 to 33 than the inductors L22 to L31, allowing the characteristic of the high-pass filter circuit 21 to be prevented from deviating from a desired characteristic.

In the present embodiment, each of the inductors L22 to L29 is arranged at a position further from the second surface 50B, in other words, the second main body 80, than the conductor layers 701 and 703 to 707 constituting the inductors L10, L12, L13, and L21. Thus, according to the present embodiment, it is possible to suppress coupling between the inductors L22 to L29 and the acoustic wave elements 31 to 33.

In the present embodiment, the conductor layers 701 and 703 to 707 are arranged at a position closer to the second surface 50B than the inductors L22 to L29, so that the space in the first main body 50 is efficiently used, downsizing the first main body 50.

In the present embodiment, the inductor L21 includes the conductor layers 695 and 697. The longitudinal direction of the conductor layer 695 and the longitudinal direction of the conductor layer 697 are intersecting with each other. Thus, according to the present embodiment, the inductor L21 can be provided with a part wound about a first axis parallel to one direction (for example, X direction) orthogonal to the stacking direction T and a part wound about a second axis parallel to another direction (for example, Y direction) orthogonal to the stacking direction T. Thus, according to the present embodiment, while increasing the inductance of the inductor L21, a space for another element such as the inductors L22 to L29 to be arranged can be secured forward of one direction parallel to the first axis and forward of one direction parallel to the second axis.

In the present embodiment, the inductor L21 includes the columnar conductors L21b1 to L21b6. In the present embodiment, currents in the columnar conductors L21b1 and L21b3 adjacent to each other flow in the same direction. Thus, according to the present embodiment, a magnetic field caused by the current that flows in each of the columnar conductors L21b1 and L21b3 can be made stronger. Similarly, in the present embodiment, currents in the columnar conductors L21b2, L21b4, and L21b6 adjacent to each other flow in the same direction. Thus, according to the present embodiment, a magnetic field caused by the current that flows in each of the columnar conductors L21b2, L21b4, and L21b6 can be made stronger.

Note that, in the present embodiment, the inductor L21 is configured as one inductor, in the circuit configuration. No other element is connected between one end and the other end of the inductor L21.

Note that the present invention is not limited to the foregoing embodiment, and various modifications may be made thereto. For example, the circuit configuration of each of the first filter 10 and second filter 20 is not limited to the example described in the embodiment, but is optional.

The second main body 80 may include one, two, or four or more acoustic wave elements. When the second main body 80 includes a plurality of acoustic wave elements, the number of acoustic wave elements provided between common terminal 2 and the second signal terminal 4 in the circuit configuration may be the same as or less than the number of acoustic wave elements included in the second main body 80. At least one acoustic wave element that is provided in the second main body 80 and is not provided between the common terminal 2 and the second signal terminal 4 in the circuit configuration has both ends short-circuited.

Note that, in the embodiment, the second main body 80 can include one other acoustic wave element in addition to the acoustic wave elements 31 to 33. Such other acoustic wave element has both ends short-circuited by the conductor layer 716 shown in FIG. 11C.

As described above, an electronic component according to the present invention includes a first main body including a plurality of dielectric layers stacked together and a second main body mounted on the first main body. The first main body includes a common terminal, at least one signal terminal, and a circuit section provided between the common terminal and the at least one signal terminal in a circuit configuration. The circuit section includes at least one inductor. The second main body includes at least one acoustic wave element that is electrically connected to the circuit section and that is connected in parallel with the at least one inductor. The at least one acoustic wave element, in a state of being electrically connected to the circuit section, is not electrically connected to a ground.

In the electronic component according to the present invention, the at least one inductor may include a plurality of inductors. The at least one acoustic wave element may include a plurality of acoustic wave elements. The plurality of inductors may be electrically connected in series. The plurality of acoustic wave elements may be electrically connected in series. The plurality of acoustic wave elements may include a specific acoustic wave element. The circuit section may further include a first capacitor provided between one end of the specific acoustic wave element and the ground, and a second capacitor provided between the other end of the specific acoustic wave element and the ground.

In the electronic component according to the present invention, the first main body may further include a high-pass filter circuit connected to the circuit section in series. The high-pass filter circuit may be provided between the common terminal and the circuit section in the circuit configuration.

In the electronic component according to the present invention, the at least one signal terminal may include a first signal terminal and a second signal terminal. The electronic component according to the present invention may further include a first filter provided between the common terminal and the first signal terminal in the circuit configuration and a second filter provided between the common terminal and the second signal terminal in the circuit configuration. The second filter may include the circuit section and the at least one acoustic wave element. The first filter may selectively pass a signal of a frequency within a first passband. The second filter may selectively pass a signal of a frequency within a second passband higher than the first passband.

In the electronic component according to the present invention, the second main body may further include at least one other acoustic wave element not provided between the common terminal and the at least one signal terminal in the circuit configuration. The at least one other acoustic wave element may have both ends short-circuited.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:
1. An electronic component comprising:
a first main body including a plurality of dielectric layers stacked together; and
a second main body mounted on the first main body, wherein the first main body includes
   a common terminal,
   at least one signal terminal, and
   a circuit section provided between the common terminal and the at least one signal terminal, in a circuit configuration,
the circuit section includes at least one inductor,
the second main body includes at least one acoustic wave element that is electrically connected to the circuit section and that is connected in parallel with the at least one inductor,
the at least one acoustic wave element, in a state of being electrically connected to the circuit section, is not electrically connected to a ground,
no other acoustic wave element is disposed between the at least one acoustic wave element and the ground, in the circuit configuration, and
the first main body further includes a high-pass filter circuit connected to the circuit section in series.

2. The electronic component according to claim 1, wherein
   the at least one inductor includes a plurality of inductors, and
   the at least one acoustic wave element includes a plurality of acoustic wave elements.

3. The electronic component according to claim 2, wherein
   the plurality of inductors are electrically connected in series, and
   the plurality of acoustic wave elements are electrically connected in series.

4. The electronic component according to claim 2, wherein
   the plurality of acoustic wave elements include a specific acoustic wave element, and
   the circuit section further includes a first capacitor provided between one end of the specific acoustic wave element and the ground, and a second capacitor provided between another end of the specific acoustic wave element and the ground.

5. The electronic component according to claim 1, wherein the high-pass filter circuit is provided between the common terminal and the circuit section, in the circuit configuration.

6. The electronic component according to claim 1, wherein
   the at least one signal terminal includes a first signal terminal and a second signal terminal,
   the electronic component further includes a first filter provided between the common terminal and the first signal terminal in the circuit configuration and a second filter provided between the common terminal and the second signal terminal in the circuit configuration, and
   the second filter includes the circuit section and the at least one acoustic wave element.

7. The electronic component according to claim 6, wherein
   the first filter selectively passes a signal of a frequency within a first passband, and
   the second filter selectively passes a signal of a frequency within a second passband higher than the first passband.

8. The electronic component according to claim 1, wherein the second main body further includes at least one other acoustic wave element not provided between the common terminal and the at least one signal terminal in the circuit configuration.

9. The electronic component according to claim 8, wherein the at least one other acoustic wave element has both ends short-circuited.

10. An electronic component comprising:
   a first main body including a plurality of dielectric layers stacked together; and
   a second main body mounted on the first main body, wherein
the first main body includes
   a common terminal,
   at least one signal terminal, and
   a circuit section provided between the common terminal and the at least one signal terminal, in a circuit configuration,
the circuit section includes at least one inductor,
the second main body includes at least one acoustic wave element that is electrically connected to the circuit section and that is connected in parallel with the at least one inductor,
the at least one acoustic wave element, in a state of being electrically connected to the circuit section, is not electrically connected to a ground,
   the at least one acoustic wave element includes a specific acoustic wave element,
the circuit section further includes a first capacitor provided between one end of the specific acoustic wave element and the ground, and a second capacitor provided between another end of the specific acoustic wave element and the ground, and
the first main body further includes a high-pass filter circuit connected to the circuit section in series.

*    *    *    *    *